US010903195B2

United States Patent
Choi et al.

(10) Patent No.: US 10,903,195 B2
(45) Date of Patent: Jan. 26, 2021

(54) HIGH-RESOLUTION MICRO-LED DISPLAY DEVICE AND MANUFACTURING METHOD OF THE SAME

(71) Applicant: LG Display Co., Ltd., Seoul (KR)

(72) Inventors: Wonjin Choi, Seoul (KR); Geesung Chae, Incheon (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/545,973

(22) Filed: Aug. 20, 2019

(65) Prior Publication Data

US 2020/0194407 A1 Jun. 18, 2020

(30) Foreign Application Priority Data

Dec. 17, 2018 (KR) .................. 10-2018-0163161

(51) Int. Cl.
*H01L 25/075* (2006.01)
*H01L 27/12* (2006.01)
*H01L 21/683* (2006.01)
*H01L 33/50* (2010.01)

(52) U.S. Cl.
CPC ...... *H01L 25/0753* (2013.01); *H01L 21/6835* (2013.01); *H01L 27/1214* (2013.01); *H01L 27/1266* (2013.01); *H01L 33/504* (2013.01); *H01L 2221/68354* (2013.01); *H01L 2221/68368* (2013.01); *H01L 2933/0041* (2013.01)

(58) Field of Classification Search
CPC ............. H01L 25/0753; H01L 21/6835; H01L 27/1214; H01L 27/1266; H01L 33/504

USPC ........................................................... 257/72
See application file for complete search history.

(56) References Cited

U.S. PATENT DOCUMENTS

| 2014/0367633 | A1* | 12/2014 | Bibl .................... | H01L 25/0753 257/13 |
| 2017/0062674 | A1* | 3/2017 | Kwon ................. | H01L 25/0753 |
| 2018/0076182 | A1* | 3/2018 | Wu ...................... | H01L 25/0753 |

(Continued)

*Primary Examiner* — Igwe U Anya
(74) *Attorney, Agent, or Firm* — Polsinelli PC

(57) ABSTRACT

A manufacturing method of a micro-LED display device comprises forming a plurality of thin-film transistor array areas that includes a plurality of thin-film transistor arrays on a first substrate; forming a plurality of micro-LED array areas that includes a plurality of micro-LED arrays on a second substrate; transferring the plurality of micro-LED array areas that correspond to the plurality of thin-film transistor array areas onto the first substrate; forming a bank film on a third substrate over the first substrate; patterning the bank film to form a first bank layer that corresponds to a boundary area between the plurality of micro-LED arrays and a second bank layer that corresponds to an edge area of the plurality of micro-LED array areas, to form a pixel area and a pixel array area, and to remove the bank film in a boundary area between the second bank layers adjacent to each other; cutting the third substrate and the first substrate along a scribe zone that is set in a boundary area between the second bank layers adjacent to each other; and separating a plurality of pixel arrays that includes the plurality of thin-film transistor arrays and the plurality of micro-LED arrays from the first substrate and transferring the plurality of pixel arrays onto a fourth substrate.

20 Claims, 18 Drawing Sheets

(56) References Cited

U.S. PATENT DOCUMENTS

2018/0308420 A1* 10/2018 Shin .................. H04N 5/374
2019/0198593 A1* 6/2019 Jo .................. H01L 51/5237

* cited by examiner

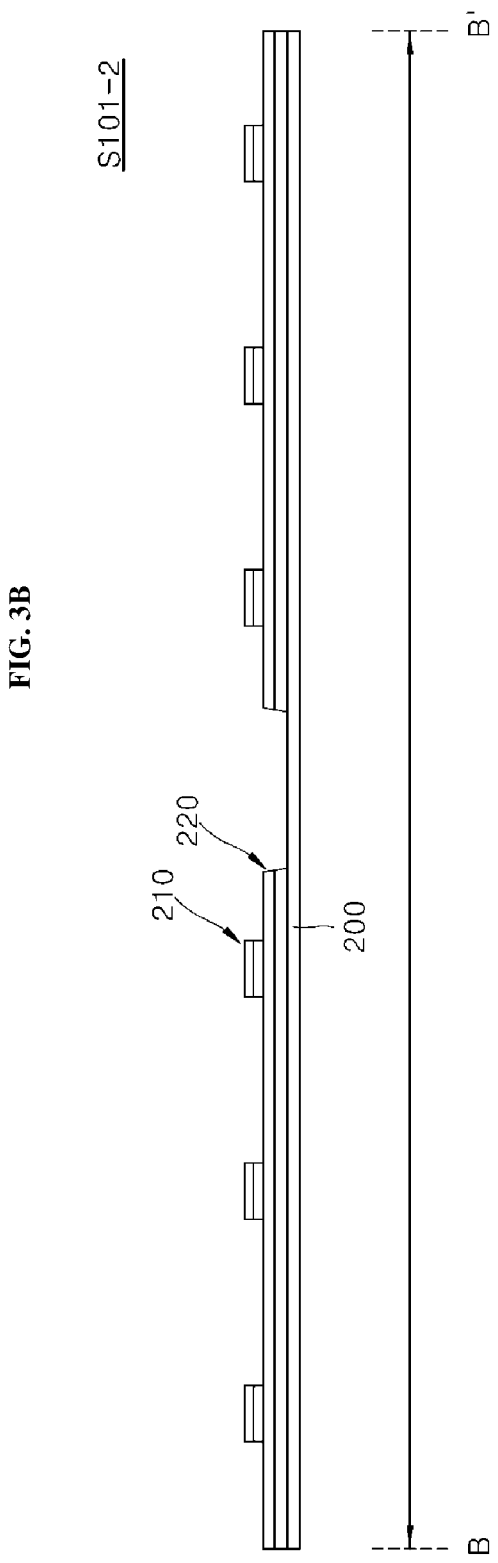

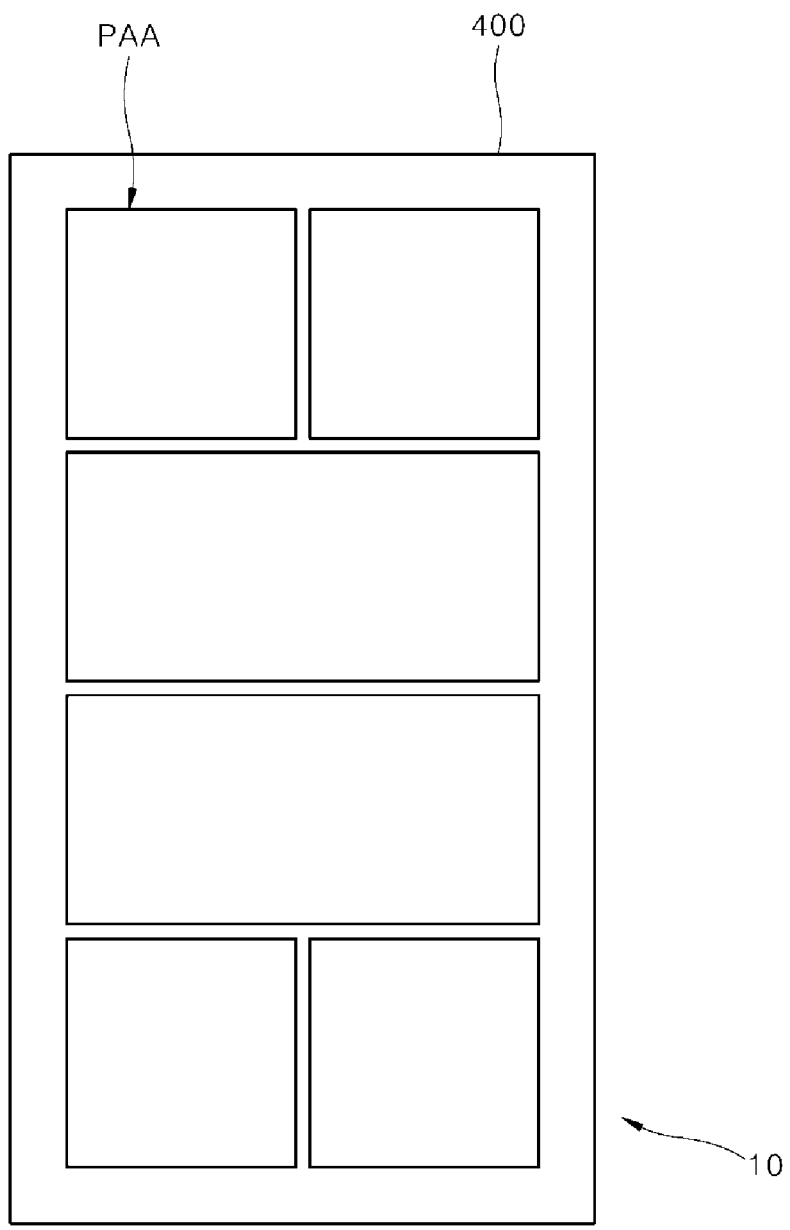

HIGH-RESOLUTION MICRO-LED DISPLAY DEVICE AND MANUFACTURING METHOD OF THE SAME

CROSS REFERENCE TO RELATED APPLICATION

This application claims priority to and the benefit of Korean Patent Application No. 10-2018-0163161 filed on Dec. 17, 2018 in the Republic of Korea, which is hereby incorporated by reference in its entirety.

BACKGROUND

Field of the Disclosure

The present disclosure relates to a display device, and more particularly, to a high-resolution micro-LED display device and a manufacturing method of the same. Although the present disclosure is suitable for a wide scope of applications, it is particularly suitable for reducing a boundary area between micro LEDs and minimizing crack propagation to micro LED elements, which can be caused during a manufacturing process.

Description of the Background

In the information society where there is a growing demand for a variety of home appliances, mobile electronic devices and the like, various flat-panel display devices that are thin and lightweight are very much in demand.

The flat-panel display device includes a liquid crystal display (LCD), a plasma display panel (PDP) display, an organic light-emitting diode (OLED) display, a micro light-emitting diode (micro LED) display and the like.

Among such devices, the organic light-emitting diode and micro light-emitting diode use a self-light emitting element. They do not require an additional light source such as a backlight that is used for a liquid crystal display device. Thus, the organic light-emitting diode and micro LED diode become thinner and can be used as various types of display devices.

In the case of an organic light-emitting diode that uses an organic material, defect pixels are very likely caused by moisture and air. Accordingly, a structure that is capable of minimizing infiltration of moisture and air is required.

In the case of a micro LED display device that uses a micro LED element that includes an inorganic material such as GaN is not largely affected by external environmental factors such as moisture, air, heat and the like, thereby ensuring reliability.

The micro LED elements of micro LED display devices may display an image with luminance higher than that of the organic light-emitting diode and may consume less energy than the organic light-emitting diode. This is because the micro light-emitting diodes have a high efficiency in internal quantum. Accordingly, research into micro LED display devices has been actively performed in recent years.

SUMMARY

Accordingly, the present disclosure is directed to a high-resolution micro-LED display device and a manufacturing method of the same that substantially obviate one or more of the problems due to limitations and disadvantages of the prior art.

One aspect of the present disclosure is to provide a high-resolution micro-LED display device and a manufacturing method of the same that can reduce a production time period, increase production yield and lower manufacturing costs.

Another aspect of the present disclosure is to provide a high-resolution micro-LED display device and a manufacturing method of the same that can minimize crack propagation to a micro LED, which may occur during the process of manufacturing a micro LED display device.

Another aspect of the present disclosure is to provide a high-resolution micro-LED display device and a manufacturing method of the same that can minimize a boundary area between micro LEDs.

Yet another aspect of the present disclosure is to provide a high-resolution micro-LED display device and a manufacturing method of the same that can minimize recognition of a boundary area between micro LEDs by a user.

The present disclosure is not limited to what has been described. Additionally, other aspects and advantages that have not been mentioned may be clearly understood from the following description and may be more clearly understood from aspects. Further, it will be understood that the aspects and advantages of the present disclosure may be realized via means and a combination thereof that are described in the appended claims.

A manufacturing method of a micro-LED display device according to the present disclosure is described as follows.

The manufacturing method may include forming a plurality of thin-film transistor arrays above a first substrate that is partitioned into a plurality of thin-film transistor array areas which include a plurality of thin-film transistor areas, and forming a plurality of micro-LED arrays above a second substrate that is partitioned into a plurality of micro-LED array areas which include a plurality of micro-LED areas.

Next, the manufacturing method may include transferring the micro-LED array that corresponds to the thin-film transistor array area onto the first substrate.

Next, the manufacturing method may include forming a third substrate and a bank film above the first substrate, and patterning the bank film to form—a first bank layer that corresponds to a boundary area between micro-LED areas and a second bank layer that corresponds to an edge area of a micro-LED array area, to form a pixel area and a pixel array area respectively and to remove a bank film in a boundary area between second bank layers adjacent to each other.

Next, the manufacturing method may include cutting the third substrate and the first substrate along a scribe zone that is set in a boundary area between the second bank layers adjacent to each other, and separating a pixel array that includes the thin-film transistor array and the micro-LED array from the first substrate and transferring the pixel array onto a fourth substrate.

In the manufacturing method of a micro-LED display device according to the present disclosure, micro LEDs may be transferred as the unit of a preset array area. Accordingly, unlike a method in which micro LEDs are transferred individually, the manufacturing method makes it possible to reduce a production time period and increase production yield.

Additionally, in the manufacturing method of a micro-LED display device according to the present disclosure, a thin-film transistor layer, a micro LED layer and a bank film that correspond to a scribe zone may be removed before the process of cutting. Accordingly, crack propagation that may happen during the process of cutting may be minimized, and a boundary area between micro LEDs may be minimized.

A micro-LED display device according to the present disclosure may include a lower substrate that defines a plurality of pixel array areas which include a plurality of pixel areas, a thin-film transistor array that is placed above the lower substrate and that includes a plurality of thin-film transistors which correspond to each of the pixel areas, a micro-LED array that is placed above the thin-film transistor array and that includes a plurality of micro LEDs which correspond to each of the pixel areas, an upper substrate that is placed above the micro-LED array, and a first bank layer that is placed in a boundary area between the pixel areas and a second bank layer that is placed in an edge area of the pixel array area, which are placed above the upper substrate.

In this case, the second bank layer is spaced a certain distance apart from an end of the upper substrate that corresponds to the pixel array area.

As described above, the micro-LED display device according to the present disclosure may minimize cracks that can be directly propagated through the second bank layer because the second bank layer is spaced a certain distance apart from an end of the upper substrate. Additionally, internal light may be re-reflected by a spaced part of the upper substrate. Thus, recognition of a boundary area by a user may be minimized.

According to the present disclosure, micro LEDs are not transferred individually. Instead, micro LEDs may be transferred as the unit of a preset array area. Thus, a production time period may be reduced. Additionally, the unit of an array area may be set in different sizes and patterns. Accordingly, an area of a circular substrate, which is not used, may be minimized. Thus, production yield may be increased, and manufacturing costs may be reduced.

According to the present disclosure, a thin-film transistor layer, a micro LED layer and a bank film that correspond to a scribe zone may be removed before the process of cutting. Accordingly, direct crack propagation through the layers and film during the process of cutting may be minimized, and a defect rate may be minimized. Additionally, because a second bank layer in an edge area of a pixel array area is spaced a certain distance apart from an end of an upper substrate. Accordingly, direct crack propagation through the second bank layer during the process of cutting may be minimized, and a defect rate may be minimized.

According to the present disclosure, the thin-film transistor layer, the micro LED layer and the bank film that correspond to the scribe zone may be removed before the process of cutting. Accordingly, a width of a dead zone for preventing damage done to elements, which may be caused by the process of cutting, may be minimized, a width of the second bank layer may be reduced, a gap between micro LEDs may be minimized, and high resolution may be implemented.

According to the present disclosure, a spaced part of the upper substrate, which is in a boundary area between micro LEDs, may re-reflect light of the micro LEDs outward, which is reflected inward by a cover layer. Thus, the boundary area between the micro LEDs recognized by a user may be minimized.

Specific effects of the present disclosure together with the above-described effects are described in the following detailed description of the disclosure.

BRIEF DESCRIPTION OF THE DRAWINGS

The accompanying drawings, which are included to provide a further understanding of the disclosure and are incorporated in and constitute a part of this application, illustrate aspects of the disclosure and together with the description serve to explain the principles of the disclosure.

In the drawings:

FIGS. 3A and 3B are a schematic plan view and a schematic cross-sectional view illustrating a process of forming a micro-LED array on a second substrate;

FIGS. 9A, 9B and 9C are schematic plan views illustrating various examples of a pixel array area that has various sizes and patterns.

DETAILED DESCRIPTION

Figure 1:
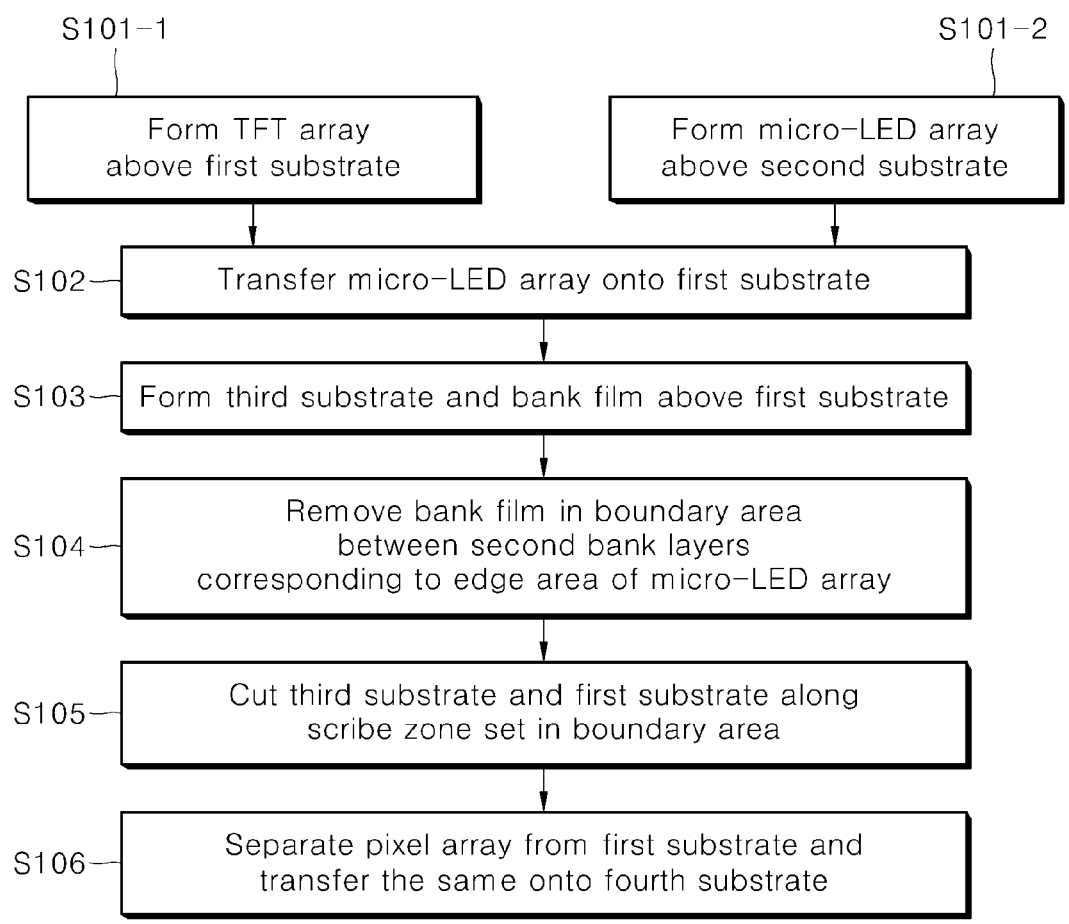
FIG. 1 is a flow chart illustrating a manufacturing method of a micro-LED display device according to the present disclosure.

The above-described features and advantages are specifically described hereunder with reference to the attached drawings. Accordingly, one having ordinary skill in the art to which the present disclosure pertains may readily implement the technical spirit of the present disclosure. Further, in describing the present disclosure, publicly-known technologies in relation to the disclosure are not specifically described if they are deemed to make the gist of the disclosure unnecessarily vague. Below, aspects are described with reference to the attached drawings. In the drawings, identical reference numerals denote identical or similar elements.

When any element is described as being "on (or under)" an element, or "above (or below)" an element, any element may be directly on (or directly under) the element, and an additional element may be interposed between the element and any element that is placed above (or below) the element.

It should be further understood that when an element is described as being "connected", "coupled" or "connected" to another element, the element may be directly connected or may be able to be directly connected to another element. However, it is also to be understood that an additional element may be "interposed" between the two elements, or the two elements may be "connected", "coupled" or "connected" through an additional element.

FIG. 1 is a flow chart illustrating a manufacturing method of a micro-LED display device 10 according to the present disclosure.

First, a plurality of thin-film transistor arrays 120 may be formed on a first substrate 100 (shown in FIG. 2A) that is partitioned into a plurality of thin-film transistor array areas (TAA) which includes a plurality of thin-film transistor areas (TA), and a plurality of micro-LED arrays 220 (shown in FIG. 3B) may be formed on a second substrate 200 (shown in FIG. 3A) that is partitioned into a plurality of micro-LED array areas (MAA) which includes a plurality of micro-LED areas (MA) (S101-1, and S101-2).

Next, the micro-LED array 220 that corresponds to the thin-film transistor array area (TAA) may be transferred onto the first substrate 100 (S102).

Next, a third substrate 300 and a bank film 310 may be formed over the first substrate 100 (S103).

Next, the bank film 310 may be patterned to form a first bank layer 311 that corresponds to a boundary area between the micro-LED areas (MA) and a second bank layer 312 that corresponds to an edge area of the micro-LED array area (MAA), to form a pixel area (PA) and a pixel array area (PAA) respectively, and to remove the bank film 310 in a boundary area between the second bank layers 312 adjacent to each other (S104).

Next, the third substrate 300 and the first substrate 100 may be cut along a scribe zone (SZ) that is set in a boundary area between the second bank layers 312 adjacent to each other (S105).

Next, a pixel array that includes the thin-film transistor array 120 and the micro-LED array 220 is separated from the first substrate 100 and is transferred onto a fourth substrate 400. Thus, a micro-LED display device 10 may be manufactured (S106).

Below, a manufacturing method of a micro-LED display device according to the present disclosure is specifically described, based on the above-described manufacturing order.

In the following description, the process of photolithography including deposition, photoresist (PR) coating, exposure, development, etching, and photoresist (PR) stripping may be used to pattern each of the layers and films. The process of photolithography is known to one having ordinary skill in the art. Accordingly, description of the process is avoided. For instance, in deposition, the process of sputtering may be used for a metallic material, and the process of plasma enhanced vapor deposition (PECVD) may be used for a semiconductor or an insulation film. Also, in etching, dry etching and wet etching may be optionally used on the basis of materials. Technologies that are used by one having ordinary skill in the art may be applied.

Figure 2A:
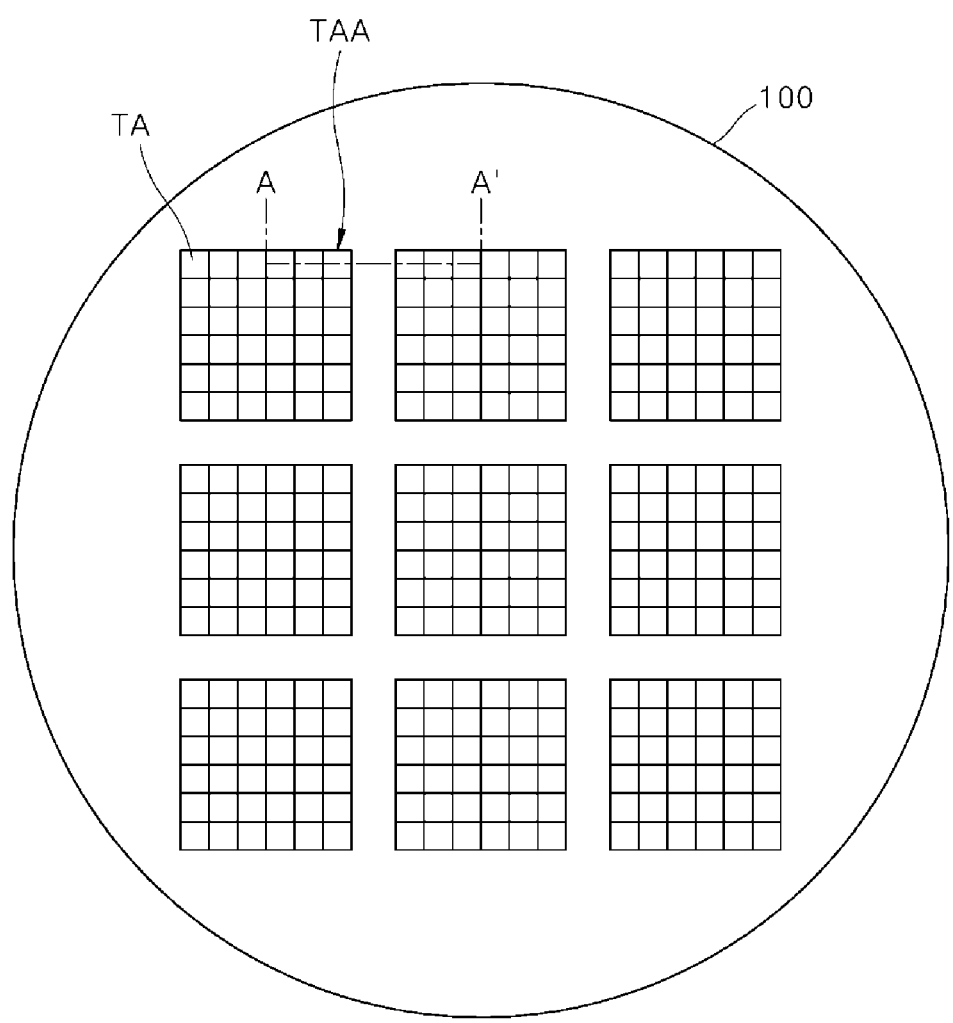
FIGS. 2A and 2B are a schematic plan view and a schematic cross-sectional view illustrating a process of forming a plurality of thin-film transistor arrays on a first substrate.
Figure 2B:
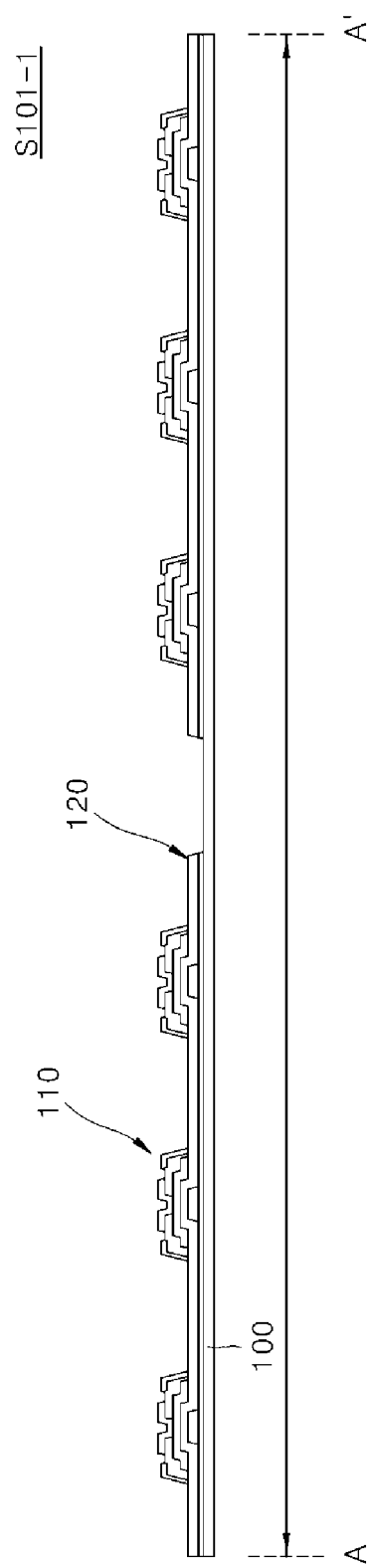

FIGS. 2A and 2B a schematic plan view and a schematic cross-sectional view illustrating a process of forming a plurality of thin-film transistor arrays 120 on the first substrate 100.

A thin-film transistor layer may be formed over a first substrate 100 such that a plurality of thin-film transistor array areas (TAA) including a plurality of thin-film transistor arrays (TA) is partitioned. That is, a plurality of thin-film transistors 110 may form a single thin-film transistor array 120.

The thin-film transistor layer may include a buffer layer 111 that is formed over the entire surface of the first substrate 100, a gate electrode 112 that is formed on the buffer layer 111, a gate insulation layer 113 that is formed over the entire surface of the first substrate 100 to cover the gate electrode 112, a semiconductor layer 114 that is formed on the gate insulation layer 113, and a first electrode 115a and a second electrode 115b that are formed on the semiconductor layer 114.

Thin-film transistors (TFT) 110 may be formed to correspond to each of the thin-film transistor arrays (TA), and may operate as a driving element that can drive a micro LED 210.

The thin-film transistor layer that corresponds to a boundary area between the thin-film transistor array areas (TAA) which are adjacent to each other may be removed through the process of patterning using etching. In this case, the removed thin-film transistor layer may be the buffer layer 111 and the gate insulation layer 113 that are formed over the entire surface of the first substrate 100.

Accordingly, the thin-film transistor array areas (TAA) that are adjacent to each other may be respectively partitioned, may not be connected to each other, and may be physically divided.

Specifically, in the plurality of thin-film transistor array areas (TAA) above the first substrate 100, the thin-film transistor layer may be patterned along a pattern of each of the thin-film transistor array areas (TAA). Accordingly, each of the thin-film transistor array areas (TAA) may be configured to separate in the shape of an island.

A size and pattern of the thin-film transistor array area (TAA) may be preset through design. Specifically, the size and pattern of the thin-film transistor array area (TAA) may be preset to correspond to the size and pattern a pixel array area (PAA) of the micro-LED display device 10, which is finally transferred to form the micro-LED display device 10.

Accordingly, the size and pattern of the plurality of thin-film transistor array areas (TAA) above the same first substrate 100 may be the same. However, each of the plurality of thin-film transistor array areas (TAA) may be set to have a different size and pattern in advance, and the size and pattern of the plurality of thin-film transistor array areas (TAA) vary depending on the size and pattern of the pixel array area (PAA) of the micro-LED display device 10, which is finally formed.

A sapphire substrate or a silicon substrate may be used as the first substrate 100. However, the first substrate 100 is not limited.

Figure 3A:
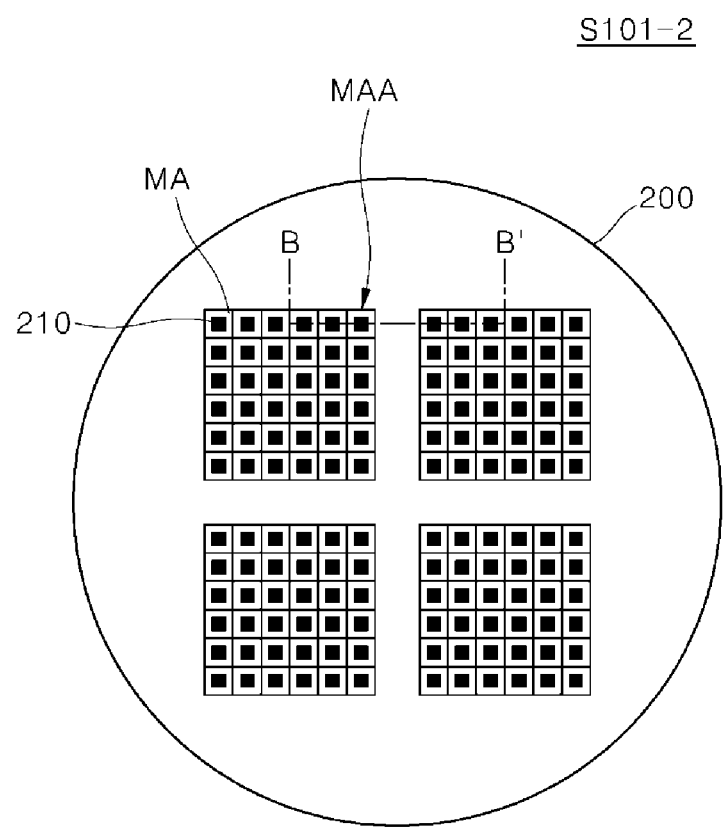

FIGS. 3A and 3B are a schematic plan view and a schematic cross-sectional view illustrating a process of forming a micro-LED array 220 on a second substrate 200.

A micro-LED layer may be formed on the second substrate 200 such that a plurality of micro-LED array areas (MAA) including a plurality of micro-LED areas (MA) is partitioned.

That is, a plurality of micro LEDs 210 may form a single micro-LED array 220, as illustrated in FIG. 3A.

The micro LED 210 may have a structure in which an undoped GaN buffer layer 211 and an n-type GaN layer 212 are formed over the entire surface of the second substrate 200, and an active layer 213 with a multi quantum well (MQW) structure and a p-type GaN layer 214 are stacked on the undoped GaN buffer layer 211 and the n-type GaN layer 212.

The micro LEDs 210 may be configured to correspond to each of the micro-LED areas (MA) and may respectively operate as a light-emitting element that emits light. In the present disclosure, the micro LED 210 that emits blue light is used. However, the micro LED 210 is not limited to what has been described, and micro LEDs 210 that respectively emit red light, green light, and blue light may be used.

The micro-LED layer that corresponds to a boundary area between the micro-LED array areas (MAA) adjacent to each other may be removed through the process of patterning using etching. In this case, the removed micro-LED layer may be the undoped GaN buffer layer 211 and the n-type GaN layer 212 that are formed over the entire surface of the second substrate 200.

Accordingly, the micro-LED array areas (MAA) adjacent to each other may be respectively partitioned, may not be connected to each other, and may be physically divided.

Specifically, in the plurality of micro-LED array areas (MAA) on the second substrate 200, the micro-LED layer may be patterned along a pattern of each of the micro-LED array areas (MAA). Accordingly, each of the micro-LED array areas (MAA) may be configured to separate in the shape of an island.

The size and pattern of the micro-LED array areas (MAA) may be set through design in advance. Specifically, the size and pattern of the micro-LED array area (MAA) may be set in advance to correspond to the pixel array area (PAA) of the micro-LED display device 10, which is finally transferred to form the micro-LED display device 10.

Accordingly, the size and pattern of the plurality of micro-LED array areas (MAA) above the same second substrate 200 may be the same. However, each of the plurality of micro-LED array areas (MAA) may be set to have a different size and pattern in advance, and the size and pattern of the plurality of micro-LED array areas (MAA) vary depending on the size and pattern of the pixel array area (PAA) of the micro-LED display device 10 that is finally formed.

That is, the size and pattern of the micro-LED array area (MAA) may correspond to the size and pattern of the above-described thin-film transistor array area (TAA) in the same manner.

A buffer layer is formed on the second substrate 200, and then a GaN thin film is grown above the buffer layer. By doing so, the micro LED 210 may be formed. In this case, sapphire, silicon (Si), GaN, silicon carbide (SiC), gallium arsenide (GaAs), zinc oxide (ZnO) and the like may be used for the second substrate 200 for growing the GaN thin film. However, materials for the second substrate are not limited to what has been described.

Specifically, the micro LED 210 is formed by crystallizing an inorganic material such as GaN on a semiconductor substrate. The process of crystallization may be commonly referred to as epitaxy, epitaxial growth or epitaxial processing.

Figure 4A:
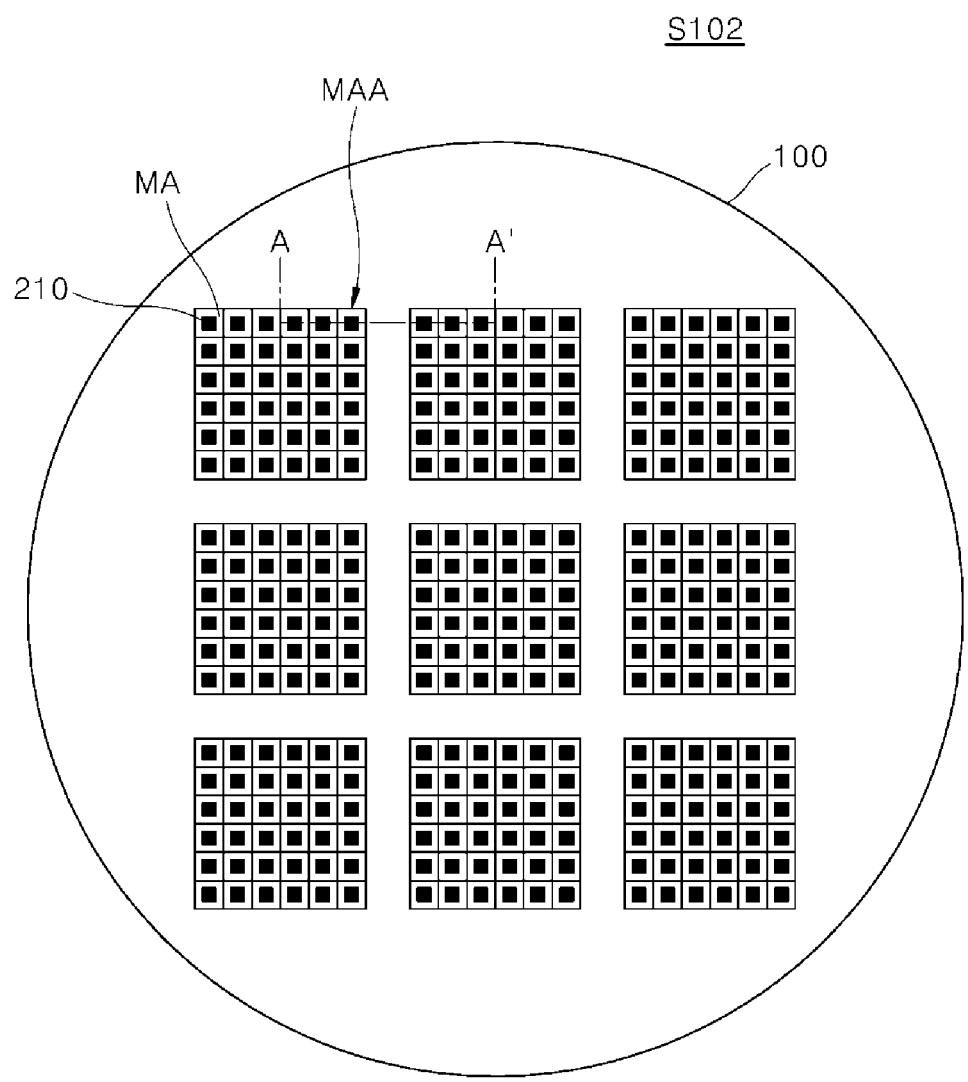
FIGS. 4A and 4B are a schematic plan view and a schematic cross-sectional view illustrating a process of transferring a micro-LED array onto the first substrate.
Figure 4B:
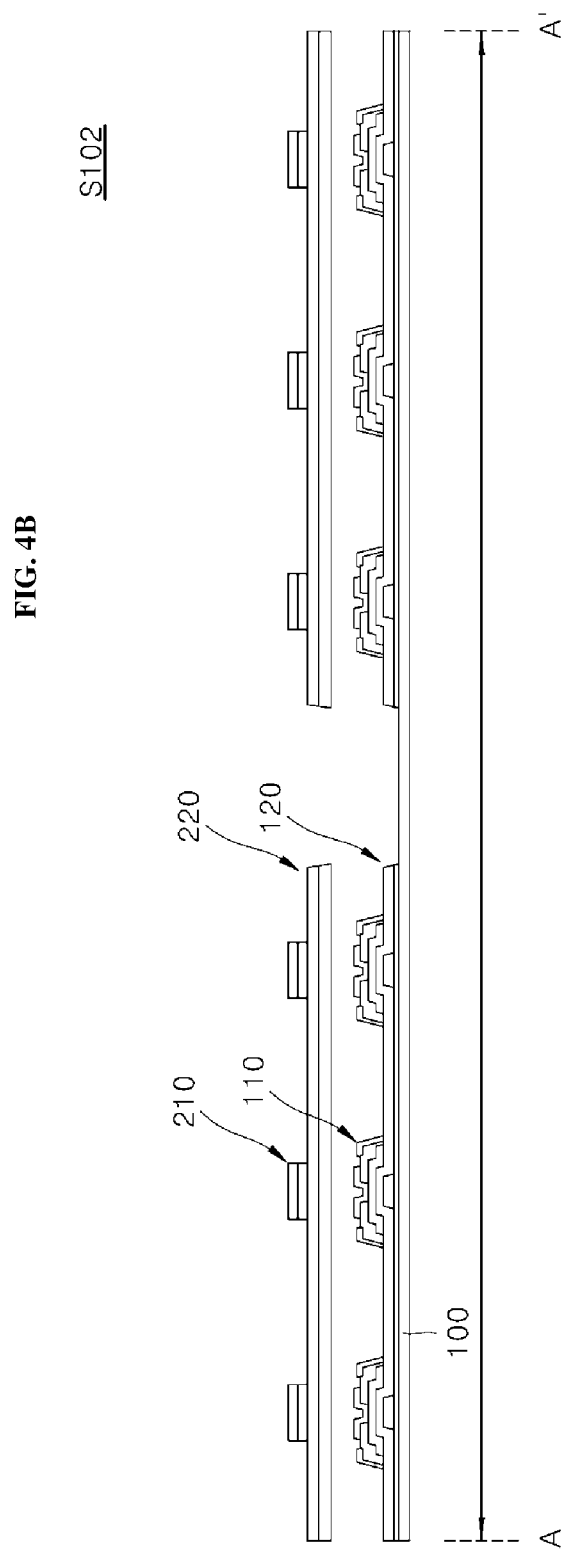

FIGS. 4A and 4B are a schematic plan view and a schematic cross-sectional view illustrating a process of transferring the micro-LED array 220 onto the first substrate 100.

Sizes and patterns of the thin-film transistor arrays 120 and the micro-LED arrays 220 are set in advance on the basis of a size and a pattern of a pixel array of a micro-LED display device 10 that is finally formed. Accordingly, the thin-film transistor arrays 120 that have a size and a pattern corresponding to those of the micro-LED arrays 220 are placed on the first substrate 100.

Thus, the micro-LED array 220 that has a size and pattern corresponding to a size and pattern of a thin-film transistor array area (TAA) is separated from a second substrate 200, and the separated micro-LED array 220 may be transferred onto the first substrate 100.

When a size of the first substrate 100 above which the thin-film transistor arrays 120 are placed is larger than a size of the second substrate 200 above which the micro-LED arrays 220 are placed, a plurality of second substrates 200 may be used to allow all the micro-LED arrays 220 of the first substrate 100 to correspond to the thin-film transistor arrays 120.

A laser lift-off (LLO) method may be used as a method for separating the micro-LED arrays 200 from the second substrate 200. However, various separation methods may be used.

A transfer method using polydimethylsiloxane (PDMS) may be used as a method for transferring the separated micro-LED arrays 200 onto the first substrate 100. However, various separation methods may be used.

Figure 5A:
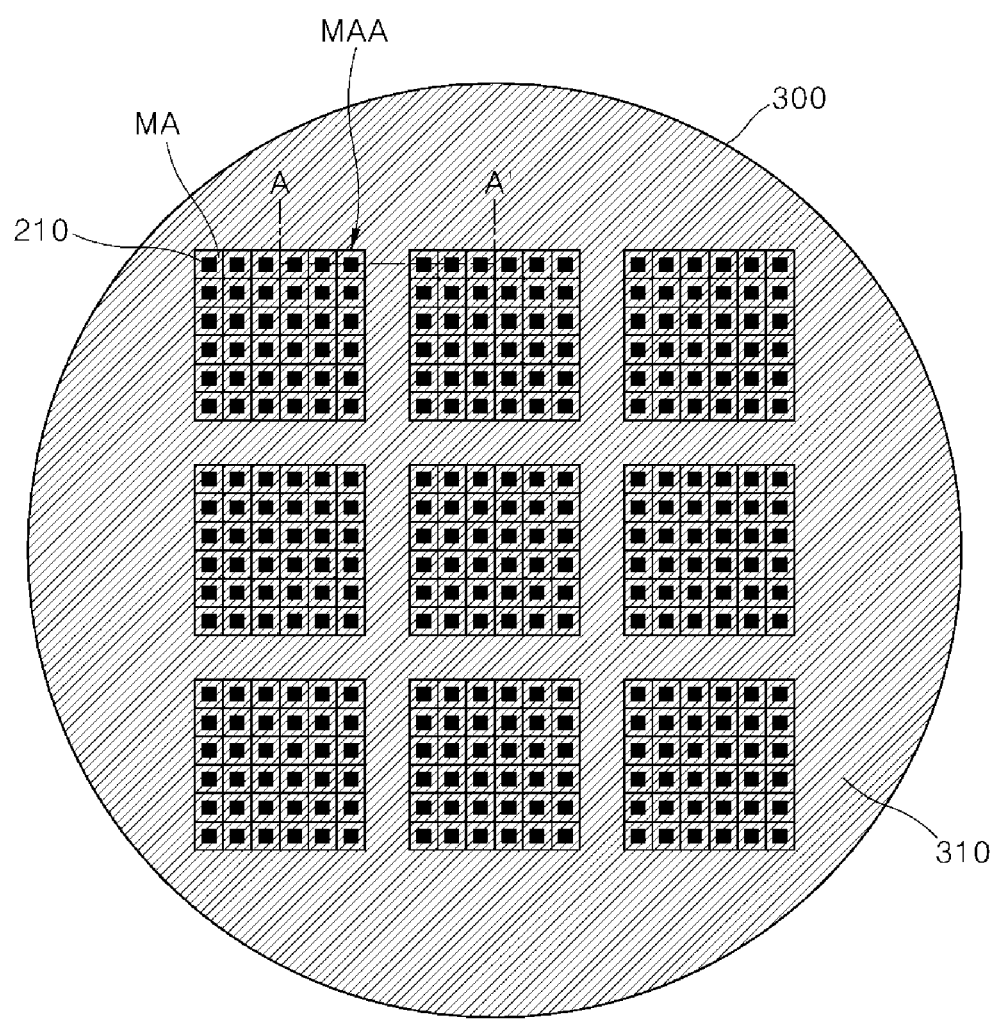
FIGS. 5A and 5B are a schematic plan view and a schematic sectional view illustrating a process of forming a third substrate and a bank film on the first substrate.
Figure 5B:
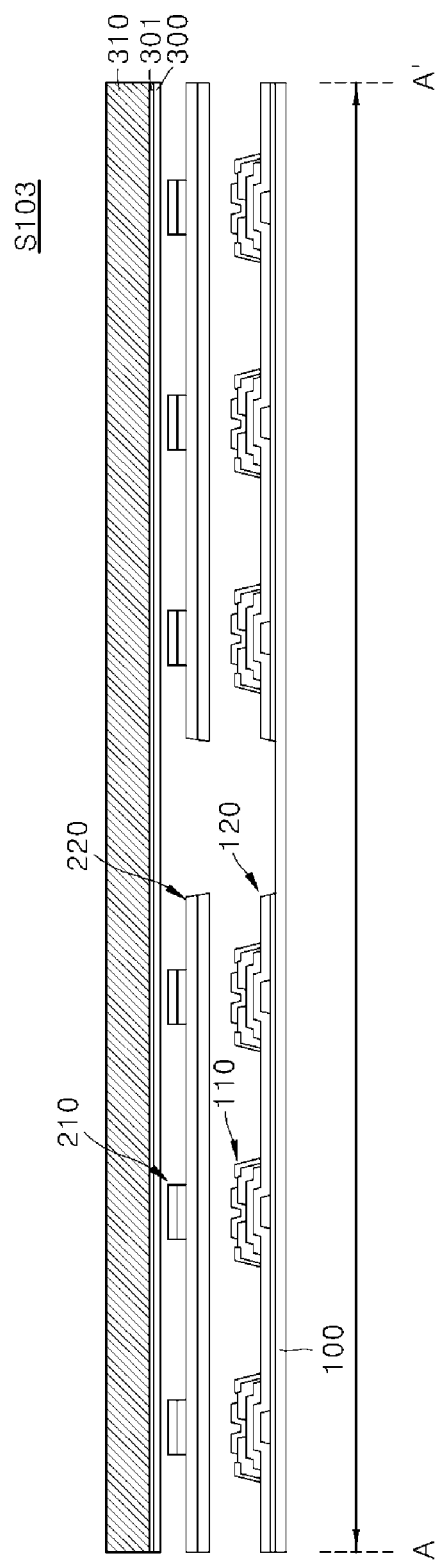

FIGS. 5A and 5B are a schematic plan view and a schematic cross-sectional view illustrating a process of forming a third substrate 300 and a bank film 310 on the first substrate 100.

A third substrate 300 may be formed on the thin-film transistor arrays 120 and the micro-LED arrays 200 that are formed on the first substrate 100, and a bank film 310 may be formed to cover the entire surface of the third substrate 300.

The bank film 310 may include an organic material or an inorganic material, and a material of the bank film 310 is not limited. When the bank film is configured to have a thick thickness, an organic material may be used.

In this case, the buffer film 301 may be additionally formed between the bank film 310 and the third substrate 300. An inorganic material may be used for the buffer film 301.

Figure 6A:
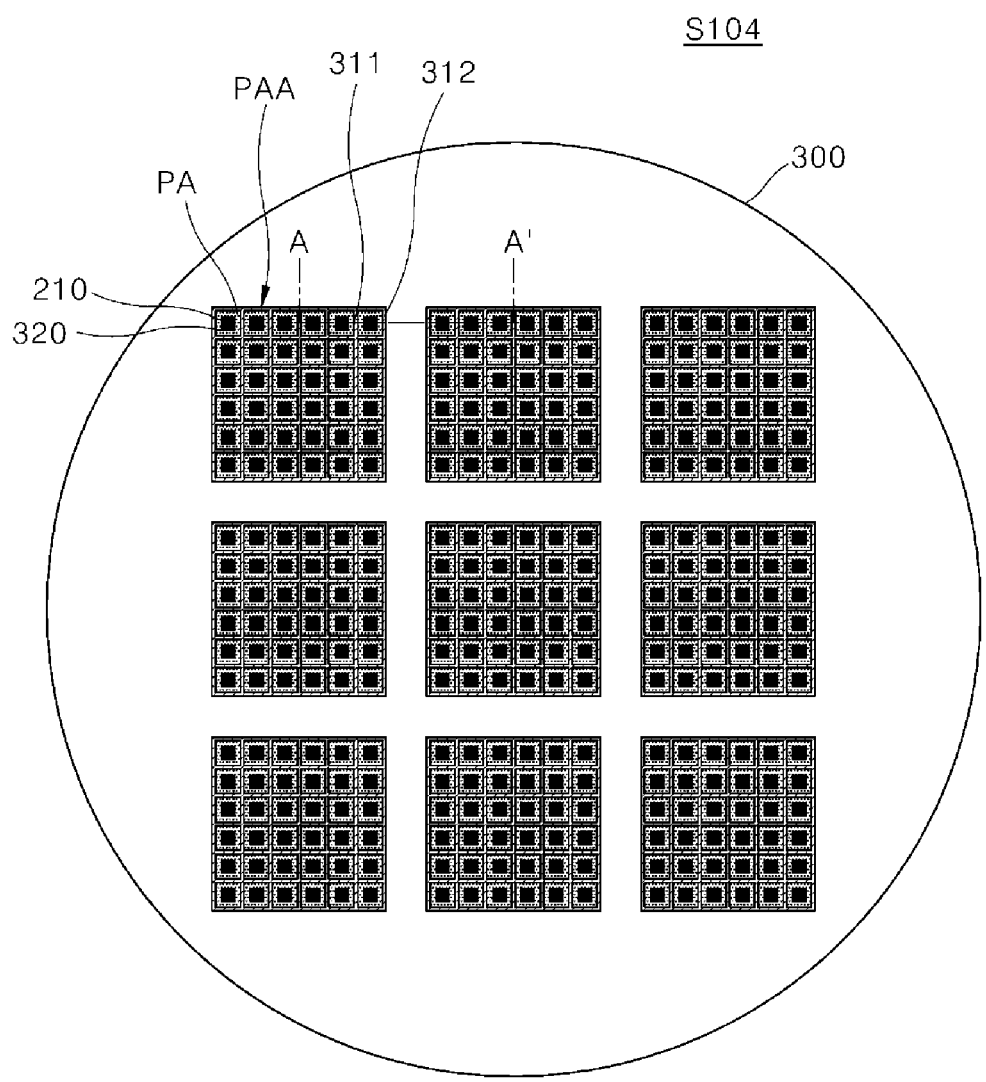
FIGS. 6A and 6B are a schematic plan view and a schematic sectional view illustrating a process of patterning the bank film.
Figure 6B:
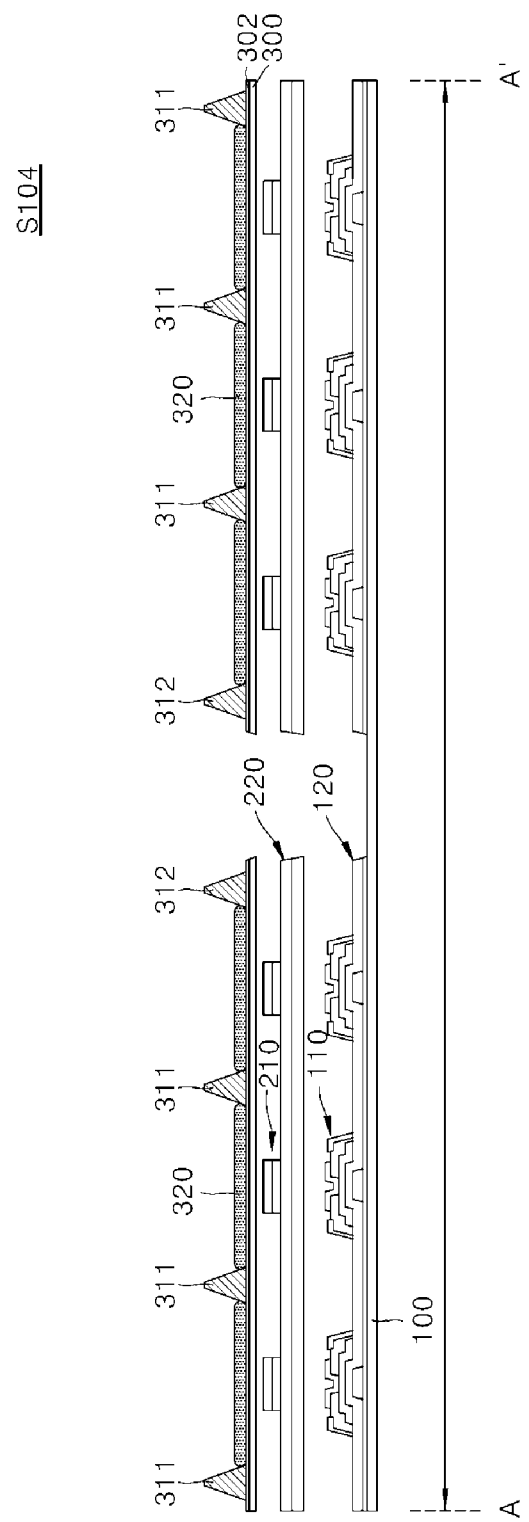

FIGS. 6A and 6B are a schematic plan view and a schematic sectional view illustrating a process of patterning the bank film 310.

The bank film 310 may be patterned and may consist of a first bank layer 311 that corresponds to a boundary area between micro-LED arrays (MA), and a second bank layer 312 that corresponds to an edge area of a micro-LED array area (MAA).

Specifically, the bank film 310 that corresponds to the boundary area between micro-LED arrays (MA) is left, and the bank film 310 that corresponds to the micro-LED array (MA) is removed. Accordingly, an area that corresponds to the micro-LED array (MA) may have an opening.

That is, the bank film 310 that corresponds to the boundary area between micro-LED arrays (MA) may be the first bank layer 311, and an area that corresponds to the opening formed between the first bank layers 311 may be defined as a pixel area (PA).

A single pixel area (PA) may include a single thin-film transistor 110, a single micro-LED 210, and an opening that is formed by the first bank layers 311.

After the bank film 310 is patterned, a color filter layer 320 may be additionally formed in each pixel area (PA).

That is, a color filter layer 320 may be formed in each opening that is formed by the first bank layers 311 and may be included in the pixel area (PA). Accordingly, light of a color desired by a user may be implemented.

A usual color filter film may be used as the color filter layer 320, and a quantum dot film may be formed with an inkjet method to form the color filter layer 320. However, a forming process of the color filter layer 320 is not limited.

For instance, a micro LED 210 that emits blue light may be used in present disclosure. In this case, the color filter layer 320 may be formed in pixel areas (PA) for implementing red and green to implement red and green, and a micro LED 210 that emits blue light may be used with no additional color filter layer 320 in pixel areas (PA) for implementing blue.

The bank film 310 that corresponds to the edge area of the micro-LED array area (MAA) may be the second bank layer 312.

The second bank layer 312 is configured to encircle the edge area of the micro-LED array area (MAA). Accordingly, the second bank layer 312 may serve as a boundary between the micro-LED array areas (MAA). Thus, a pixel array area (PAA) may be defined.

The second bank layer 312 may be patterned in the same form as the first bank layer 311.

Specifically, the bank film 310 that corresponds to an edge area of the micro-LED array area (MAA) is left, and the bank film 310 that corresponds to the micro-LED area (MA) is removed except the first bank layer 311. Thus, the second bank layer 312 may be formed.

Like the area between the first bank layers 311, an area between the first bank layer 311 and the second bank layer 312 may be defined as a pixel area (PA) and may have an opening from which the bank film 310 is removed. Accordingly, a color filter layer 320 may also be formed in the opening in the pixel area (PA) between the first bank layer 311 and the second bank layer 312.

Additionally, the bank film 310 according to an aspect of the present disclosure may be patterned with the method of etching such that the bank films 310 not only in the area that corresponds to the pixel area (PA) but also in the boundary area between the second bank layers 312 adjacent to each other are removed.

As described above, the second bank layer 312 may serve as a boundary between the micro-LED array areas (MAA) and may also serve as a boundary between the pixel array areas (PAA).

That is, a boundary area exists among pixel array areas (PAA). During the process of patterning for forming the first bank layer 311 and the second bank layer 312, the bank film 310 that corresponds to the boundary area is removed. Accordingly, an opening is formed in a boundary area between second bank layers 312 adjacent to each other.

The opening formed in the boundary area between second bank layers 312 adjacent to each other may be configured to match an area which is placed below the opening and in which a thin-film transistor layer is removed in the boundary area between thin-film transistor array areas (TAA) adjacent to each other, and an area which is placed below the opening and in which a micro-LED layer is removed in the boundary area between micro-LED array areas (MAA) adjacent to each other.

Accordingly, a third substrate 300 from which a micro-LED layer is removed, and a first substrate 100 from which a thin-film transistor layer is removed may be placed below the opening that is formed in the boundary area between the second bank layers 312 adjacent to each other.

When a buffer film 301 is formed between the third substrate 300 and the bank film 310, the buffer film 301 may also be patterned to correspond to the opening formed in the boundary area between the second bank layers 312 adjacent to each other, and may be formed as a buffer layer 302 of the third substrate corresponding to each of the pixel array areas (PAA).

The boundary area between the second bank layers 312 adjacent to each other may match a scribe zone (SZ) that is defined during a process of cutting the third substrate 300, which is performed in the next step. However, the boundary area may be wider than the scribe zone (SZ).

The first bank layer 311 and the second bank layer 312 may be used as a wall that serves as a boundary to form each pixel area (PA) and each pixel array area (PAA), and may prevent different colors of light rays that are emitted from each pixel area (PA) from being mixed.

Figure 7A:
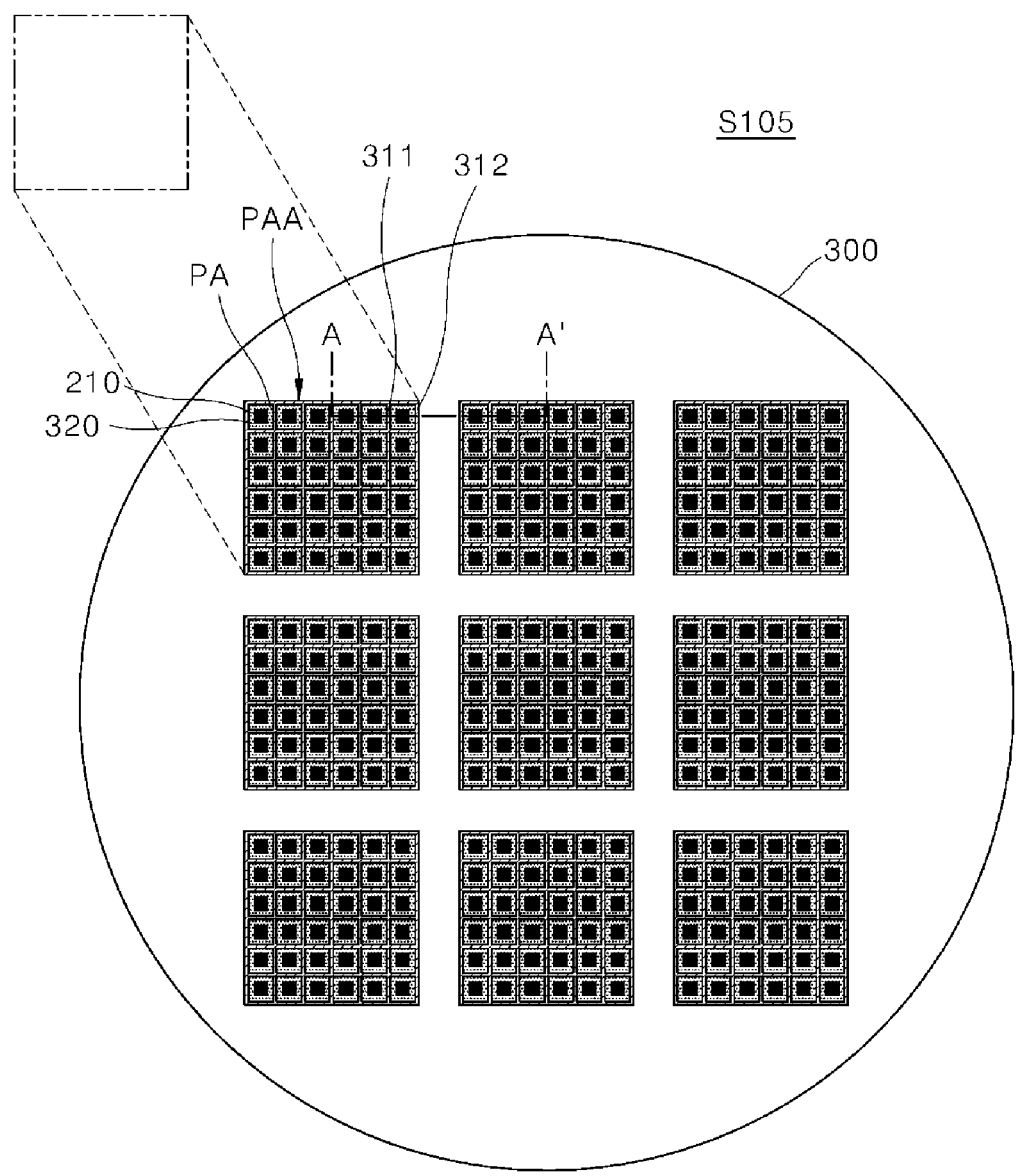
FIGS. 7A and 7B are a schematic plan view and a schematic sectional view illustrating a process of cutting the third substrate and the first substrate.
Figure 7B:
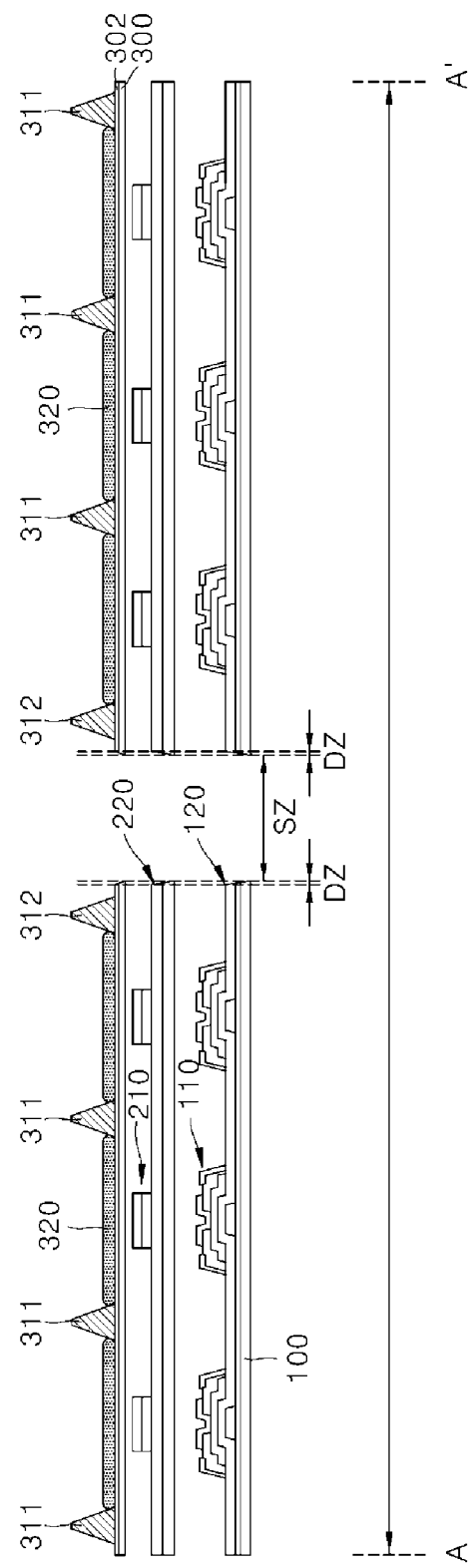

FIGS. 7A and 7B are a schematic plan view and a schematic cross-sectional view illustrating a process of cutting the third substrate 300 and the first substrate 100.

As illustrated in FIGS. 7A and 7B, the third substrate 300 and the first substrate 100 may be laser-cut along a scribe zone (SZ) that is set in a boundary area between second bank layers 312 adjacent to each other.

In this case, the scribe zone (SZ) may be configured to match the boundary area between second bank layers 312 adjacent to each other but may be narrower than the boundary area, as described above.

When the laser-cutting is performed in the state in which the scribe zone (SZ) is set to be the same as or narrower than the boundary area between second bank layers 312 adjacent to each other, the second bank layer 312, the micro-LED layer, and the thin-film transistor layer and the scribe zone (SZ) are not overlapped, and the layers are not directly affected by laser-cutting. Thus, crack propagation to each element may be minimized, thereby reducing a defect rate.

On the contrary, when laser-cutting is performed in the state in which the bank film 310, the micro-LED layer and the thin-film transistor layer that correspond to the scribe zone (SZ) are not removed, the bank film 310, the micro-LED layer, and the thin-film transistor layers are directly affected by laser-cutting. Accordingly, a crack may be propagated to elements such as the micro-LED 210 and the thin-film transistor 110, thereby increasing a defect rate.

Additionally, as a buffer area, a dead zone (DZ) that serves as a buffer material to minimize crack propagation is required to be set relatively widely in advance in the bank film 310, the micro-LED layer, and the thin-film transistor layer.

That is, to minimize the effect of laser-cutting on the elements, a dead zone (DZ) that may serve as a buffer area may be set between the elements and the scribe zone (SZ). The dead zone (DZ) may be set between the elements such as the second bank layer 312, the micro-LED layer, and the thin-film transistor layer, and the scribe zone (SZ). Accordingly, the dead zone (DZ) may be formed along both lateral lines of the scribe zone (SZ).

However, when the dead zone (DZ) of the second bank layer 312 is configured to be wide, the second bank layer 312 becomes wide. Accordingly, in a micro-LED display device 10 to which the pixel array is finally transferred, a gap between pixels that have the second bank layer 312 therebetween becomes wide.

Thus, high resolution may be hardly implemented due to a wider gap between pixels, and a wider boundary area may be recognized by a user.

However, when the boundary area that corresponds to the scribe zone (SZ) is patterned in advance by etching before the process of laser-cutting, as in an aspect of the present disclosure, the second bank layer 312, the micro-LED layer, and the thin-film transistor layer are not directly affected by the process of laser-cutting. Accordingly, crack propagation to each element may be minimized, and a defect rate may be decreased.

In an aspect of the present disclosure, the dead zone (DZ) that is a buffer area for minimizing crack propagation may be relatively narrow.

When the dead zone (DZ) is configured to be narrow as in the aspect, in the micro-LED display device 10 to which the pixel array is finally transferred, a distance among pixels that have the second bank layer 312 therebetween may be as short as possible. Thus, high resolution may be implemented, and recognition of the boundary area by a user may be minimized.

Figure 8:
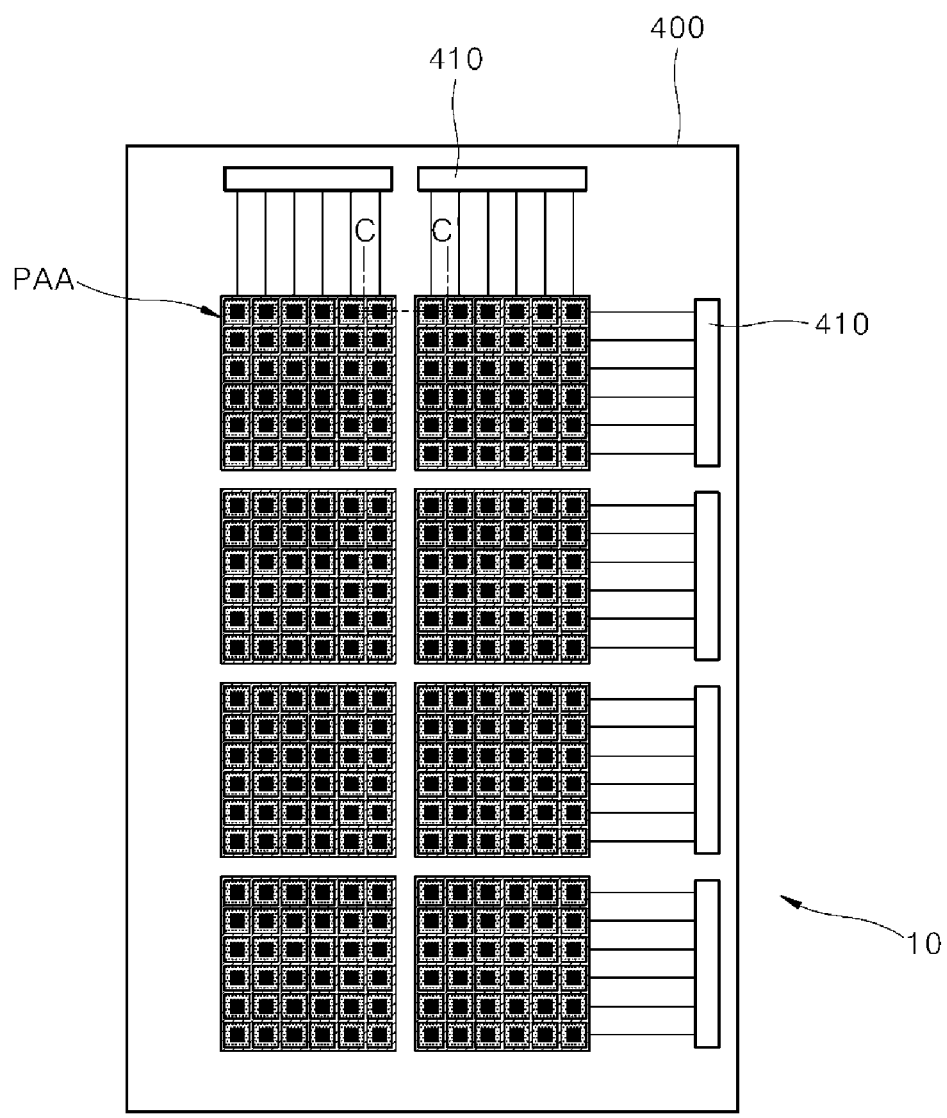
FIG. 8 is a schematic plan view illustrating processes of separating a pixel array from the first substrate and transferring the separated pixel array onto a fourth substrate.

FIG. 8 is a schematic plan view illustrating processes of separating a pixel array from a first substrate 100 and transferring the separated pixel array onto a fourth substrate 400.

In the processes of FIGS. 7A and 7B, pixel arrays in each pixel array area (PAA) are laser-cut in a predetermined size and pattern. The cut pixel arrays are transferred onto a fourth substrate 400 that is a base substrate of the micro-LED display device 10.

In this case, the pixel arrays are formed in a size and pattern that correspond to a size and pattern of the pixel array area (PAA) formed in the fourth substrate 400 from the step of forming a thin-film transistor array area (TAA). Accordingly, the pixel arrays that are transferred onto the fourth substrate 400 may be finally transferred to match pixel array areas (PAA) of a micro-LED display device 10 designed by a user.

Figure 9A:
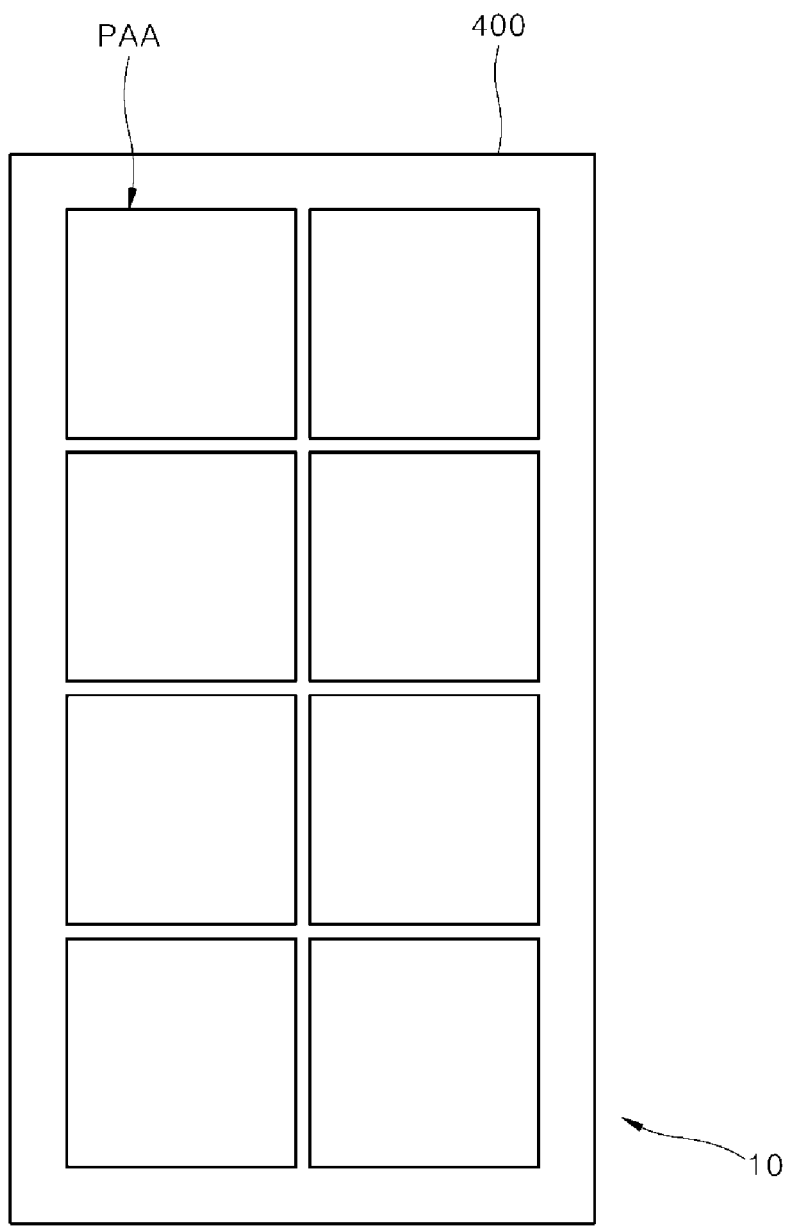
Figure 9B:
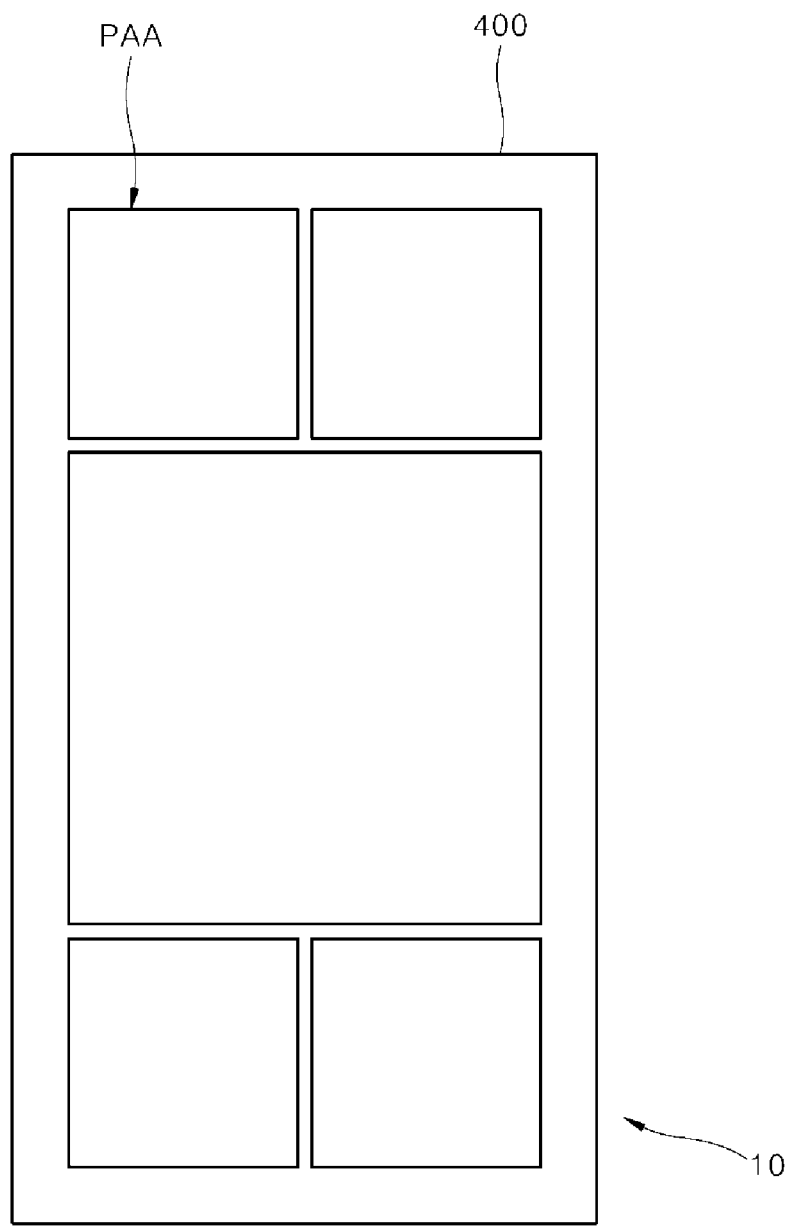

In the fourth substrate 400, sizes and patterns of the pixel array area (PAA) that is designed by a user in advance may vary as illustrated in FIGS. 9A, 9B and 9C.

The size and pattern of the pixel arrays may vary, thereby increasing a production yield rate.

Specifically, when a circular silicon wafer substrate is used as the first substrate 100 and the second substrate 200, all the area of the circular silicon wafer substrate may be hardly used like other circular substrates.

According to a manufacturing method for a micro-LED display device 10 of an aspect, sizes and patterns of pixel arrays may vary. Thus, even when a circular silicon wafer substrate is used, processing is performed such that a wasted area may be minimized, thereby increasing a production yield rate.

For instance, when pixel array areas (PAA) having a very large size are required, pixel arrays having a size that corresponds to a size of pixel array areas (PAA) are formed on a substrate. Additionally, the rest area of the substrate, except the area which is used by the pixel array areas (PAA) having a large size, may be used by pixel array areas (PAA) having a small size.

Thus, pixel arrays of a large size may be formed, and pixel arrays of a small size adequate for the rest area, except the area that is used by the pixel arrays of a large size, may be additionally formed. Thus, almost all of the area of the substrate may be used for forming pixel arrays without being wasted.

The area of the substrate may be used as much as possible without being wasted, thereby increasing a production yield rate and decreasing production costs.

In a manufacturing method for a micro-LED 210 display device according to an aspect, micro LEDs 210 are not individually transferred. Instead, as a unit, a micro-LED array 220 that includes a plurality of micro LEDs 210, i.e., a pixel array, is transferred at a time, thereby improving efficiency of processing and minimizing a gap between pixel areas (PA).

When micro LEDs 210 are cut and transferred one by one, each boundary area among the micro LEDs 210 is required to be cut. Accordingly, a bank layer that encircles each micro LED 210 may become thicker.

For instance, according to an aspect, the first bank layer 311 is formed to correspond to a boundary area between pixel areas (PA). A pixel array area (PAA) that includes a plurality of pixel areas (PA) is cut and transferred as a unit. Accordingly, a boundary area between pixel areas (PA) is not required to be cut. Thus, the first bank layer 311 may not have a wide width.

On the contrary, when micro LEDs 210 are cut and transferred one by one, a boundary area between pixel areas (PA) is required to be cut. Accordingly, a width of a bank layer corresponding to the first bank layer 311 according to an aspect is required to be wide enough to include a dead zone (DZ) having a predetermined width.

Thus, a width of the bank layer that encircles each of the cut micro LEDs 210 becomes wider, and a gap between pixel areas (PA) also becomes wider because a plurality of bank layers serve as a boundary between micro LEDs 210.

In this case, the boundary area between pixel areas (PA) may be recognized by a user due to a wider gap between the pixel areas (PA). Additionally, when each of the micro LEDs 210 is cut, the bank layers that encircle the micro LEDs 210 are cut. Accordingly, a crack is likely propagated to elements adjacent to the bank layers, thereby increasing the possibility of causing a defect in each micro LED 210.

However, according to the present disclosure, micro LEDs 210 are not cut and transferred one by one. Instead, a micro-LED array 220 that includes a plurality of micro LEDs 210 is cut and transferred as a unit. Thus, the possibility of crack propagation may be reduced, gaps among pixel areas (PA) may be minimized, high resolution may be implemented, and recognition of a boundary area by a user may be minimized.

A plurality of pixel arrays are transferred onto the fourth substrate 400, and pad units such as a gate pad unit or a readout integrated circuit (ROIC) pad unit that can connect various signals and power to the transferred pixel arrays, and cables may be formed in the fourth substrate 400, to constitute the micro-LED display device 10.

Figure 10:
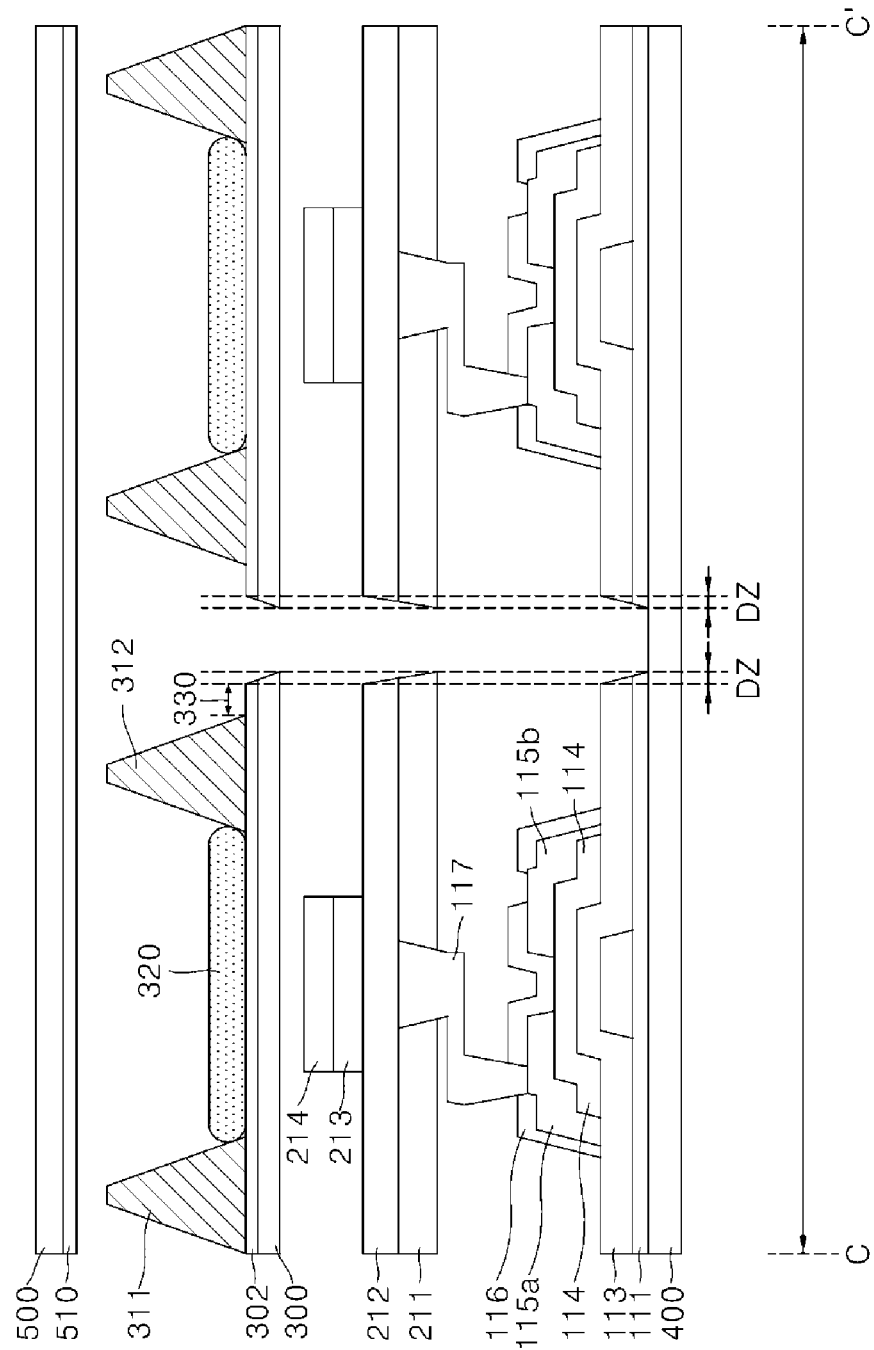
FIG. 10 is a cross-sectional view illustrating a partial area of a micro-LED display device according to the present disclosure.

FIG. 10 is a cross-sectional view illustrating a partial area of a micro-LED display device 10 according to an aspect of the present disclosure.

The micro-LED display device 10 according to the present disclosure may include a lower substrate 100 that defines a plurality of pixel array areas (PAA) which include a plurality of pixel areas (PA), a thin-film transistor layer that is placed above the lower substrate 100 and that includes a plurality of thin-film transistors 110 which correspond to each of the pixel areas (PA), a micro-LED layer that is placed above the thin-film transistor layer and that includes a plurality of micro LEDs 210 which correspond to each of the pixel areas (PA), an upper substrate 300 that is placed above the micro-LED layer, and a first bank layer 311 that is placed in a boundary area between the pixel areas (PA) and a second bank layer 312 that is placed in an edge area of a pixel array area (PAA), which are placed above the upper substrate 300. In this case, the second bank layer 312 may be spaced a certain distance apart from an end of the upper substrate 300 that corresponds to the pixel array area (PAA).

Additionally, a cover layer 500 that is an outermost surface of the micro-LED display device 10 may be placed above the upper substrate 400, and a polarizing layer 510 may be placed below the cover layer 500.

The lower substrate 100 may be used as a thin-film transistor array substrate, and glass or plastic materials may be used for the lower substrate 100. Additionally, a flexible substrate that consists of a plastic material having flexibility such as polyimide may be used as the lower substrate 100.

A plurality of pixel array areas (PAA) that include a plurality of pixel areas (PA) are defined above the lower substrate 100.

Specifically, each of the thin-film transistors 110 is formed to correspond to each of the pixel areas (PA) in each pixel area (PA). A plurality of thin-film transistors 110 that are formed as described above are gathered. By doing so, a thin-film transistor array 120 that corresponds to the pixel array area (PAA) may be formed.

Thin-film transistor arrays 120 may be formed in the state of being separated from one another in boundary areas among pixel array areas (PAA). The thin-film transistor arrays 120 may be physically separated from one another but may be electrically connected to one another by various cables that are formed above the lower substrate 100.

Specifically, a buffer layer 111 may be first formed above the lower substrate 100. SiO2 may be used for the buffer layer 111 and the buffer layer 111 may be formed in a single layer or in multiple layers.

The buffer layer 111 that is configured to cover all the plurality of pixel areas (PA) may be configured to cover the lower substrate 100 that corresponds to a single pixel array area (PAA).

The buffer layers 111 in pixel array areas (PAA) adjacent to each other may be separated from each other along a boundary area between the pixel array areas (PAA).

A thin-film transistor 110 may be formed above the buffer layer 111. The thin-film transistor 110 may include a gate electrode 112 that is formed above the lower substrate, a gate insulation layer 113 that is formed over a whole surface of the lower substrate 100 to cover the gate electrode 112, a semiconductor layer 114 that is formed above the gate insulation layer 113, and a first electrode 115a and a second electrode 115b that are formed above the semiconductor layer 114.

The gate electrode 112 may consist of a metallic material such as Cr, Mo, Ta, Cu, Ti, and Al, or an alloy thereof but is not limited.

The gate insulation layer 113 may be formed to cover the gate electrode 112 over the whole surface of the lower substrate 100 above the gate electrode 112. Accordingly, the gate insulation layer 113 may cover all the gate electrodes 112 of the plurality of thin-film transistors 110 that correspond to the plurality of pixel areas (PA).

That is, the gate insulation layer 113 that is configured to cover all the plurality of pixel areas (PA) may be configured to cover the lower substrate 100 that corresponds to a single pixel array area (PAA).

However, gate insulation layers 113 in pixel array areas (PAA) adjacent to each other may be separated from each other along a boundary area between the pixel array areas (PAA).

The gate insulation layer 113 may be formed in a single layer that consists of an inorganic material such as SiOx and SiNx, or in multiple layers that include SiOx and SiNx.

The semiconductor layer 114 may be formed above the gate insulation layer 113. The semiconductor layer 114 may consist of an amorphous semiconductor such as amorphous silicon and may consist of an oxide semiconductor such as IGZO (Indium Gallium Zinc Oxide), TiO2, ZnO, $WO_3$, and $SnO_2$, but is not limited.

The first electrode 115a and the second electrode 115b that are connected with the semiconductor layer 114 may be formed above the semiconductor layer 114. The first electrode 115a may be a source electrode, and the second electrode 115b may be a drain electrode. However, the source electrode and the drain electrode may be exchanged on the basis of a direction of electric currents. The first electrode 115a and second electrode 115b may consist of a metallic material such as Cr, Mo, Ta, Cu, Ti, and Al, or an alloy thereof but is not limited.

In the present disclosure, a bottom gate-type thin-film transistor in which a gate electrode 112 is placed below a semiconductor layer 114 is described as an example. However, the thin-film transistor 110 is not limited to what has been described. Various types of thin-film transistors such as a top gate-type thin-film transistor 110 may be applied.

A micro LED 210 that corresponds to a pixel area (PA) may be formed above the thin-film transistor 110. An insulation layer may be placed between each thin-film transistor 110 and each micro LED 210. In this case, the insulation layer may be formed in a single organic layer that consists of an organic material such as photoacryl or in a single inorganic layer that consists of an inorganic material, and may be formed in multiple layers that consist of organic and inorganic materials.

The thin-film transistor 110 may be electrically connected with the micro LED 210 through a third electrode 117 and may serve as a driving element that drives the micro LED 210. A method of connecting the thin-film transistor 110 and the micro LED 210 is not limited. The thin-film transistor 110 and the micro LED 210 may be connected using various methods.

The micro LED 210 may have a structure in which an undoped GaN buffer layer 211, an n-type GaN layer 212, an active layer 213 having a multi quantum well (MQW) structure, and a p-type GaN layer 214 are stacked.

Additionally, an ohmic contact layer that is placed above the p-type GaN layer 214, a p-type electrode that contacts a part of the ohmic contact layer, and an n-type electrode that contacts a part of the n-type GaN layer 212 which is exposed by etching a part of the active layer 213, the p-type GaN layer 214 and the ohmic contact layer may be further formed in the micro LED 210.

The n-type GaN layer 212 is a layer for providing electrons to the active layer 213. The n-type GaN layer 212 may be formed by doping n-type impurities such as silicon to a GaN semiconductor layer.

The active layer 213 is a layer that emits light by coupling of injected electrons and holes. In the multi quantum well structure of the active layer 213, a plurality of barrier layers and a plurality of well layers are alternately arranged. The well layer may consist of InGaN, and the barrier layer may consist of GaN but are not limited to what has been described.

The p-type GaN layer 214 is a layer for injecting holes to the active layer 213. The p-type GaN layer 214 may be formed by doping p-type impurities such as Mg, Zn and Be to a GaN semiconductor layer.

The ohmic contact layer is a layer for allowing the p-type GaN layer 214 to ohmically contact the p-type electrode. Transparent metal oxides such as indium tin oxide (ITO), indium gallium zinc oxide (IGZO), and indium zinc oxide (IZO) may be used for the ohmic contact layer.

The p-type electrode and n-type electrode may be formed in a single layer or in multiple layers that consist of at least one of metallic materials including Ni, Au, Pt, Ti, Al, and Cr, or an alloy thereof.

In the micro LED 210 with the structure, as a voltage is applied to the p-type electrode and n-type electrode, electrons and holes are respectively injected from the n-type GaN layer 212 and the p-type GaN layer 214 to the active layer 213. Then excitons are generated in the active layer 213. As the excitons are decayed, light that corresponds to a difference in energy of a lowest unoccupied molecular orbital (LUMO) and a highest occupied molecular orbital (HOMO) of a light-emitting layer is generated and emitted outward.

In this case, wavelengths of light that is emitted from the micro LED 210 may be adjusted by adjusting a thickness of the barrier layer of the multi quantum well structure of the active layer 213. In the present disclosure, a micro LED 210 that emits blue light is used. However, the micro LED 210 is not limited to what has been described.

The structure of the micro LED 210 according to the present disclosure is not limited to a specific structure. Micro LEDs 210 with various structures such as a vertically structured micro LED and a horizontally structured micro LED may be applied.

An upper substrate 300 may be formed above the micro LED layer that includes a plurality of micro LEDs 210. In this case, the upper substrate 300 is formed to have a size and patterns that correspond to a size and pattern of each of the pixel array areas (PAA). Accordingly, upper substrates 300 in the pixel array areas (PAA) adjacent to each other may be spaced apart from each other with a boundary area between the upper substrates 300.

A first bank layer 311 in a boundary area between pixel areas (PA), and a second bank layer 312 in an edge area of the pixel array area (PAA) may be placed above the upper substrate 300.

A buffer layer 302 of a third substrate may be formed between the upper substrate 300, and the first bank layer 311 and the second bank layer 312. In this case, the buffer layer 302 of the third substrate may be formed along a whole surface of the upper substrate 300 to correspond to a single pixel array area.

The bank layers may be used as a wall that serves as a boundary to form each pixel area (PA) and each pixel array area (PAA), and may prevent different colors of light rays that are emitted from each pixel area (PA) from being mixed.

In this case, the second bank layer 312 may be spaced a certain distance apart from an end of the upper substrate 300 that corresponds to the pixel array area (PAA).

That is, in the micro LED display device 10 according to the present disclosure, the second bank layer 312 above the upper substrate 300 is not matched with the end of the upper substrate 300 but is spaced a certain distance apart from the end of the upper substrate 300. Accordingly, the second bank layer 312 does not correspond to a scribe zone (SZ), thereby minimizing crack propagation that may happen during a process of cutting the upper substrate 300 and bank film 310.

Specifically, in the micro-LED display device 10 according to the present disclosure, pixels that correspond to each pixel area (PA) are not respectively cut and transferred to the lower substrate 100. Instead, each pixel array that includes a plurality of pixels is cut and transferred. In this case, a structure for minimizing crack propagation particularly in boundary areas among pixel arrays may be required.

The end of the upper substrate 300 corresponds to a boundary part of the scribe zone (SZ) that is cut in the laser-cutting process. Accordingly, when the second bank layer 312 is configured to match the end of the upper substrate 300, a crack may is propagated through the second bank layer 312 during the process of cutting the upper substrate 300 and may affect a micro LED element, a thin-film transistor element and the like in the pixel area (PA).

According to the present disclosure, the second bank layer 312 may be spaced a certain distance apart from the end of the upper substrate 300 and may be spaced a certain distance apart from the boundary part of the scribe zone (SZ), thereby minimizing the effect of a crack, which is propagated through the second bank layer 312 during the process of cutting the upper substrate 300, on a micro LED element, a thin-film transistor element and the like in the pixel area (PA).

Additionally, the buffer layer 302 of the third substrate may be removed to match an end of the second bank layer 312. Accordingly, the buffer layer 302 of the third substrate does not correspond to the scribe zone, thereby minimizing the effect of a crack, which is propagated through the buffer layer 302 of the third substrate during the process of cutting the upper substrate 300, on a micro LED element, a thin-film transistor element and the like in the pixel area (PA).

According to the present disclosure, the second bank layer 312 is spaced a certain distance apart from the end of the upper substrate 300. Accordingly, the second bank layer 312 is not formed at the end of the upper substrate 300, and a spaced part 330 that is exposed to the outside is formed at the end of the upper substrate 300.

Light that is emitted in the pixel area (PA) is reflected inward by a cover layer 500, and the spaced part 330 may re-reflect reflected light of the micro LED 210 outward. Accordingly, the spaced part 330 has the effect of emitting light in the boundary area without an additional light source such as the micro LED 210. As a result, recognition of boundary areas among micro LEDs 210 by a user may be minimized.

Specifically, light is not emitted in the boundary area because a micro LED 210 is not placed in a boundary area between micro LEDs 210. In this case, a user may recognize the boundary area from the outside. Accordingly, light is required to be sent to the boundary area as much as possible such that the user may not recognize the boundary area from the outside.

However, according to the present disclosure, the spaced part 330 of the upper substrate 300 in a boundary area between micro LEDs 210 may re-reflect light, reflected inward by the cover layer 500, outward. Accordingly, the spaced part 330 may perform the function that emits light in the boundary area, thereby minimizing recognition of the boundary area between micro LEDs 210 by a user.

According to the present disclosure, micro LEDs 210 are not transferred one by one. Instead, as a unit, a micro-LED array 220 that includes a plurality of micro LEDs 210, i.e., a pixel array, is transferred at a time, thereby minimizing a distance among pixel areas (PA).

Accordingly, a distance between the micro LEDs 210 that have the first bank layer 311 therebetween may be shorter than a distance between the micro LEDs 210 that have the second bank layer 312 therebetween.

For instance, the first bank layer 311 according to an aspect is formed to correspond to a boundary area between pixel areas (PA), and a pixel array area (PAA) that includes a plurality of pixel areas (PA) is cut and transferred as a unit. Accordingly, the boundary area between pixel areas (PA) is not required to be cut, and the first bank layer 311 is not required to have a wide width.

When the micro LEDs 210 are cut and transferred one by one, a boundary area between pixel areas (PA) is required to be cut. Accordingly, a bank layer is required to have a wide width to include a dead zone (DZ) having a predetermined width.

Thus, a width of the bank layer that encircles each of the cut micro LEDs 210 becomes wide, and a gap between pixel areas (PA) becomes wide because a plurality of bank layers serve as a boundary between micro LEDs 210.

In this case, the boundary area between pixel areas (PA) may be recognized by a user due to a wider gap between the pixel areas (PA). Additionally, when each of the micro LEDs 210 is cut, the bank layers that encircle the micro LEDs 210 are cut. Accordingly, a crack is likely propagated to elements adjacent to the bank layers, thereby increasing the possibility of causing a defect in micro LEDs 210.

However, according to an aspect of the present disclosure, micro LEDs 210 are not cut and transferred one by one. Instead, a micro-LED array 220 that includes a plurality of micro LEDs 210 is cut and transferred as a unit. Thus, the possibility of crack propagation may be reduced, gaps among pixel areas (PA) may be minimized, recognition of a boundary area by a user may be minimized, and high resolution may be implemented.

The first bank layer 311 and second bank layer 312 may have an inclined surface that faces toward a direction in which the micro LED 210 emits light. Accordingly, luminous efficiency of the micro LED 210 may improve.

Additionally, surfaces on which adjacent second bank layers 312 face each other may also be inclined surfaces that faces toward a direction in which the micro LED 210 emits light. Accordingly, luminous efficiency of the micro LED 210 may improve further.

Specifically, an additional micro LED 210 is not placed in an area between second bank layers 312 adjacent to each other. However, when light of the micro LED 210, which is emitted in the pixel area (PA), reflects from the cover layer 500 above the micro LED 210 and comes into the micro-LED display device, the light may be re-reflected outward by the inclined surfaces of the second bank layers 312.

The plurality of pixel array areas (PAA) of the micro LED display device 10 according to the present disclosure may have the same size and pattern. However, the pixel array areas (PAA) may have different sizes and patterns by proving a different size to at least one pixel array area (PAA).

A color filter layer 320 that corresponds to the pixel area (PA) may be placed above the upper substrate 300.

That is, the color filter layer 320 may be formed in each of the openings that are formed by the first bank layers 311 and may be included in the pixel area (PA). Accordingly, the color filter layer 320 may emit light of a color desired by a user.

A usual color filter film may be used as the color filter layer 320, and a quantum dot film may be formed with an inkjet method to form the color filter layer 320. However, the color filter layer 320 is not limited.

For instance, a micro LED 210 that emits blue light may be used in an aspect. In this case, the color filter layer 320 may be formed in pixel areas (PA) for implementing red and green to implement red and green, and a micro LED 210 that emits blue light may be used with no additional color filter layer 320 in pixel areas (PA) for implementing blue.

Additionally, a pad area may be formed above the lower substrate 100 except the pixel array area (PAA), and a pad unit 410 that includes various connection cables and the like may supply various signals and voltages to the pixel area (PA).

The present disclosure has been described with reference to the attached drawings. However, the present disclosure should not be construed as being limited to the aspects and drawings set forth herein. Additionally, it will be apparent that the disclosure may be modified in different forms by one having ordinary skill in the art within the technical spirit of the present disclosure. Further, although effects of configurations of the present disclosure are not described explicitly in description of the aspects, expected effects based on the configurations should be included in the scope of the present disclosure.

What is claimed is:

1. A manufacturing method of a micro-LED display device, comprising:
    forming a plurality of thin-film transistor array areas that includes a plurality of thin-film transistor arrays on a first substrate;
    forming a plurality of micro-LED array areas that includes a plurality of micro-LED arrays on a second substrate;
    transferring the plurality of micro-LED array areas that correspond to the plurality of thin-film transistor array areas onto the first substrate;
    forming a bank film on a third substrate over the first substrate;
    patterning the bank film to form a first bank layer that corresponds to a boundary area between the plurality of micro-LED arrays and a second bank layer that corresponds to an edge area of the plurality of micro-LED array areas, to form a pixel area and a pixel array area, and to remove the bank film in a boundary area between the second bank layers adjacent to each other;
    cutting the third substrate and the first substrate along a scribe zone that is set in a boundary area between the second bank layers adjacent to each other; and
    separating a plurality of pixel arrays that includes the plurality of thin-film transistor arrays and the plurality of micro-LED arrays from the first substrate and transferring the plurality of pixel arrays onto a fourth substrate.

2. The manufacturing method of a micro-LED display device of claim 1, further comprising removing a thin-film transistor layer that corresponds to a boundary area between the plurality of thin-film transistor array areas adjacent to each other, and removing a micro-LED layer that corresponds to a boundary area between the plurality of micro-LED array areas adjacent to each other before the forming of the plurality of thin-film transistor array areas and the forming of the plurality of micro-LED array areas respectively includes.

3. The manufacturing method of a micro-LED display device of claim 2, wherein the bank layer, the thin-film transistor layer, and the micro-LED layer are removed by etching.

4. The manufacturing method of a micro-LED display device of claim 1, wherein a size and pattern of the plurality of thin-film transistor array areas is the same as a size and pattern of the plurality of micro-LED array areas.

5. The manufacturing method of a micro-LED display device of claim 1, wherein the cutting the third substrate and the first substrate is performed by a laser.

6. The manufacturing method of a micro-LED display device of claim 1, wherein the boundary area between the second bank layers adjacent to each other has a width greater than a width of the scribe zone.

7. The manufacturing method of a micro-LED display device of claim 1, wherein at least one of the plurality of pixel arrays has a different size.

8. The manufacturing method of a micro-LED display device of claim 1, further comprising forming a color filter layer in each of the plurality of pixel arrays over the third substrate after the patterning the bank film.

9. A micro-LED display device comprising:
    a lower substrate where a plurality of pixel array areas that include a plurality of pixel arrays is defined;
    a thin-film transistor array placed over the lower substrate and including a plurality of thin-film transistors which correspond to each of the plurality of pixel arrays;
    a micro-LED array placed over the thin-film transistor array and including a plurality of micro LEDs which correspond to each of the plurality of pixel arrays;

an upper substrate placed over the micro-LED array; and
a first bank layer placed in a boundary area between the plurality of pixel arrays and a second bank layer placed in an edge area of the plurality of pixel array areas, which are placed over the upper substrate,
wherein the second bank layer is spaced apart from an end of the upper substrate that corresponds to the plurality of pixel arrays.

10. The micro-LED display device of claim 9, wherein a distance between the micro LEDs that have the first bank layer therebetween is shorter than a distance between the micro LEDs that have the second bank layer therebetween.

11. The micro-LED display device of claim 9, wherein the first bank layer and the second bank layer have an inclined surface that faces a direction in which the micro LED emits light.

12. The micro-LED display device of claim 9, wherein adjacent two second bank layers face each other have a surface that is inclined to face a direction in which the micro LED emits light.

13. The micro-LED display device of claim 9, wherein at least one of the plurality of pixel array areas has a different size.

14. The micro-LED display device of claim 9, further comprising a color filter layer that corresponds to the pixel area is placed over the upper substrate.

15. A manufacturing method of a micro-LED display device, comprising:
    removing a thin-film transistor layer that corresponds to a boundary area between a plurality of thin-film transistor array areas to be formed;
    removing a micro-LED layer that corresponds to a boundary area between a plurality of micro-LED array areas to be formed;
    forming the plurality of thin-film transistor array areas that includes a plurality of thin-film transistor arrays on a first substrate;
    forming the plurality of micro-LED array areas that includes a plurality of micro-LED arrays on a second substrate;
    transferring the plurality of micro-LED array areas that correspond to the plurality of thin-film transistor array areas onto the first substrate;
    forming a bank film on a third substrate over the first substrate;
    patterning the bank film to form a first bank layer that corresponds to a boundary area between the plurality of micro-LED arrays and a second bank layer that corresponds to an edge area of the plurality of micro-LED array areas, to form a pixel area and a pixel array area, and to remove the bank film in a boundary area between the second bank layers adjacent to each other;
    cutting the third substrate and the first substrate along a scribe zone that is set in a boundary area between the second bank layers adjacent to each other; and
    separating a plurality of pixel arrays that includes the plurality of thin-film transistor arrays and the plurality of micro-LED arrays from the first substrate and transferring the plurality of pixel arrays onto a fourth substrate.

16. The manufacturing method of a micro-LED display device of claim 15, wherein a size and pattern of the plurality of thin-film transistor array areas is the same as a size and pattern of the plurality of micro-LED array areas.

17. The manufacturing method of a micro-LED display device of claim 15, wherein the cutting the third substrate and the first substrate is performed by a laser.

18. The manufacturing method of a micro-LED display device of claim 15, wherein the boundary area between the second bank layers adjacent to each other has a width greater than a width of the scribe zone.

19. The manufacturing method of a micro-LED display device of claim 15, wherein at least one of the plurality of pixel arrays has a different size.

20. The manufacturing method of a micro-LED display device of claim 15, further comprising forming a color filter layer in each of the plurality of pixel arrays over the third substrate after the patterning the bank film.

* * * * *